(12) United States Patent  
Nishio

(10) Patent No.: US 12,376,221 B2  
(45) Date of Patent: Jul. 29, 2025

(54) CIRCUIT BOARD AND METHOD OF MANUFACTURING CIRCUIT BOARD

(71) Applicant: Murata Manufacturing Co., Ltd., Nagaokakyo (JP)

(72) Inventor: Kosuke Nishio, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 267 days.

(21) Appl. No.: 18/127,688

(22) Filed: Mar. 29, 2023

(65) Prior Publication Data

US 2023/0239996 A1 Jul. 27, 2023

Related U.S. Application Data

(63) Continuation of application No. PCT/JP2021/033730, filed on Sep. 14, 2021.

(30) Foreign Application Priority Data

Oct. 13, 2020 (JP) .................................. 2020-172347

(51) Int. Cl.
- *H05K 1/02* (2006.01)
- *H05K 1/03* (2006.01)
- *H05K 3/46* (2006.01)

(52) U.S. Cl.
CPC ......... *H05K 1/0218* (2013.01); *H05K 1/0242* (2013.01); *H05K 1/036* (2013.01); *H05K 1/0366* (2013.01); *H05K 3/4644* (2013.01)

(58) Field of Classification Search
CPC .... H05K 1/0218; H05K 1/0242; H05K 1/036; H05K 1/0366; H05K 1/034; H05K 1/147;

(Continued)

(56) References Cited

U.S. PATENT DOCUMENTS

| 4,215,387 A | 7/1980 | Negishi et al. |
| 2013/0127560 A1* | 5/2013 | Kato ................... H03H 7/38 333/12 |

(Continued)

FOREIGN PATENT DOCUMENTS

| JP | 54061251 U | 4/1979 |
| JP | 04048677 A | 2/1992 |

(Continued)

OTHER PUBLICATIONS

International Search Report in PCT/JP2021/033730, mailed Dec. 7, 2021, 4 pages.

(Continued)

*Primary Examiner* — Roshn K Varghese  
(74) *Attorney, Agent, or Firm* — Keating & Bennett, LLP

(57) ABSTRACT

A board main body includes first and second resin layers contacting each other and including thermoplastic resin, a first signal conductor layer on an upper main surface of the second resin layer, an overlapping region in which the first and second resin layers are present when viewed in an up-down direction, and a non-overlapping region in which the first resin layer is not present and the second resin layer is present when viewed in the up-down direction. The first signal conductor layer includes a first curved portion in which the first signal conductor layer is curved in the up-down direction such that the first signal conductor layer in the first non-overlapping region is above the first signal conductor layer in the overlapping region. The first signal conductor layer is electrically connectable to an element on the board main body in the first non-overlapping region.

26 Claims, 22 Drawing Sheets

(58) Field of Classification Search
CPC ...... H05K 1/118; H05K 1/189; H05K 3/4644; H05K 3/365; H05K 2201/0154; H05K 2201/015; H01P 3/08; H01B 7/0838
See application file for complete search history.

(56) References Cited

U.S. PATENT DOCUMENTS

| | | |
|---|---|---|
| 2014/0262448 A1 | 9/2014 | Kato |
| 2016/0064793 A1 | 3/2016 | Yosui |
| 2017/0149111 A1 | 5/2017 | Yosui et al. |
| 2019/0141831 A1 | 5/2019 | Baba |
| 2020/0137895 A1* | 4/2020 | Wu ..................... H05K 1/118 |
| 2021/0029822 A1 | 1/2021 | Yosui |

FOREIGN PATENT DOCUMENTS

| | | |
|---|---|---|
| JP | 2002100842 A | 4/2002 |
| JP | 2016131375 A | 7/2016 |
| WO | 2013080887 A1 | 6/2013 |
| WO | 2015087893 A1 | 6/2015 |
| WO | 2015194434 A1 | 12/2015 |
| WO | 6048633 B1 | 12/2016 |
| WO | 2018025697 A1 | 2/2018 |
| WO | 2019216188 A1 | 11/2019 |

OTHER PUBLICATIONS

Written Opinion in PCT/JP2021/033730, mailed Dec. 7, 2021, 5 pages.

* cited by examiner

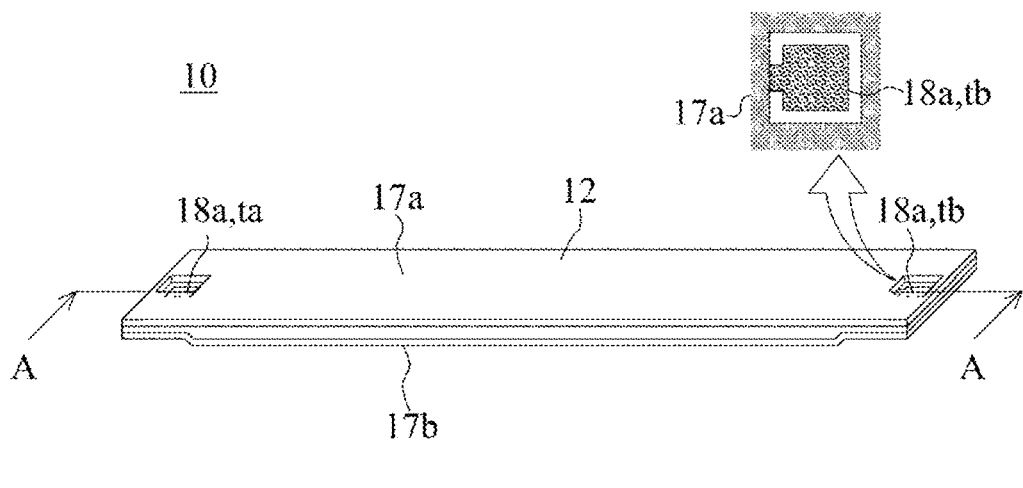
Fig.1
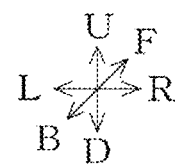

Fig.2
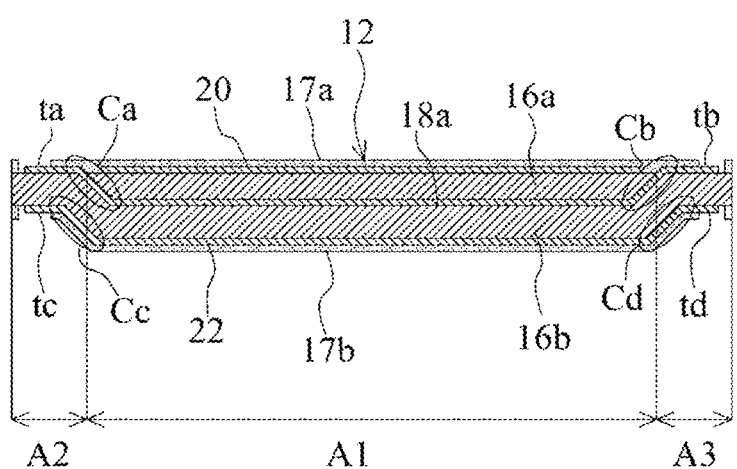
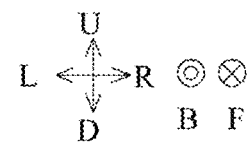

Fig.3
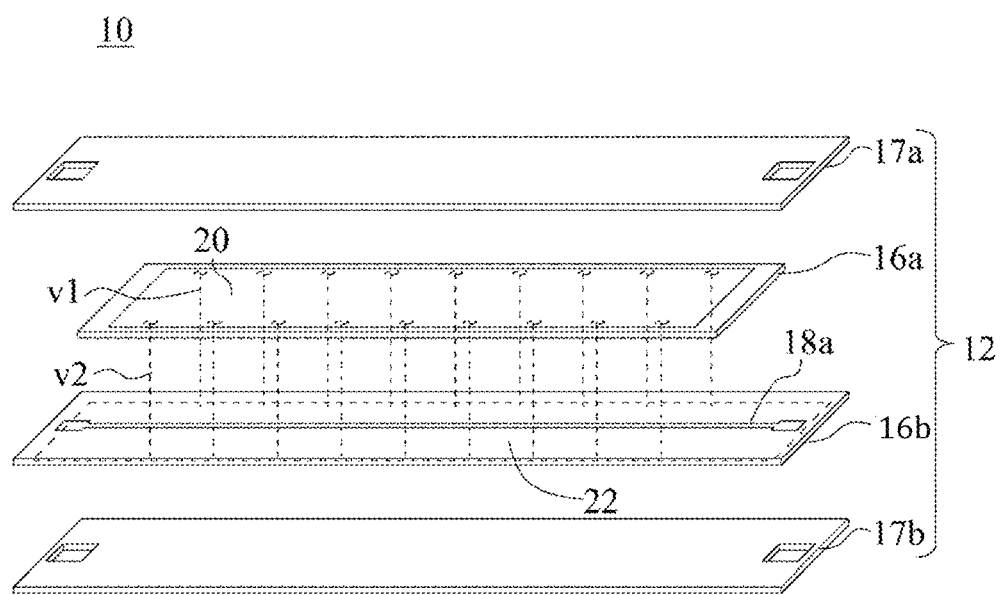

Fig.5
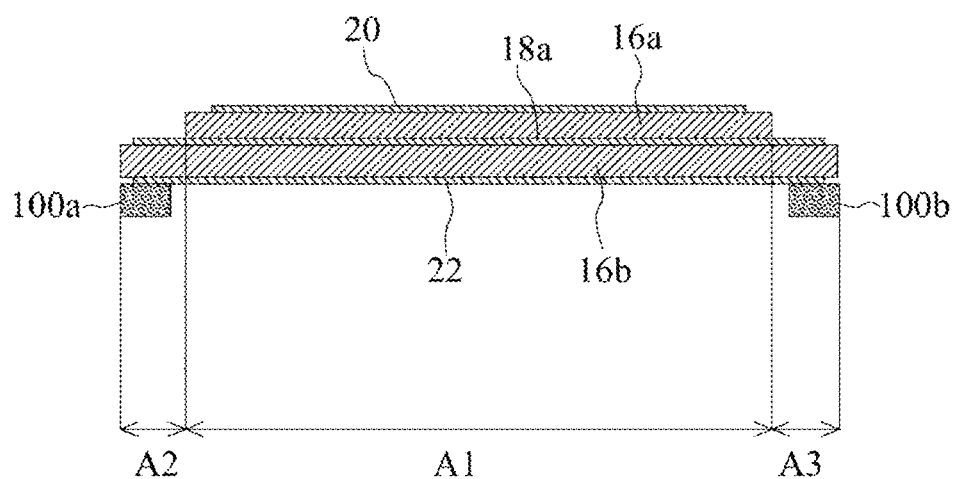
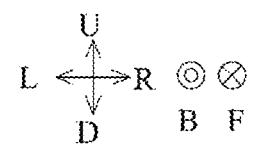

Fig.6
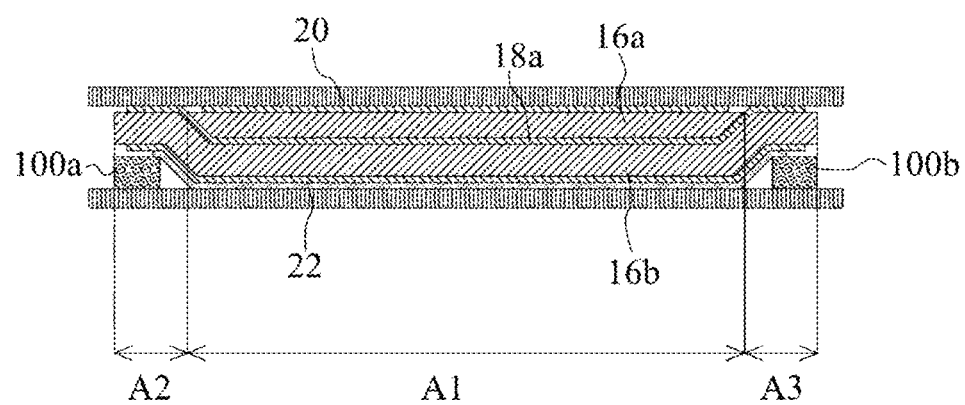
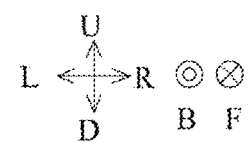

Fig.7
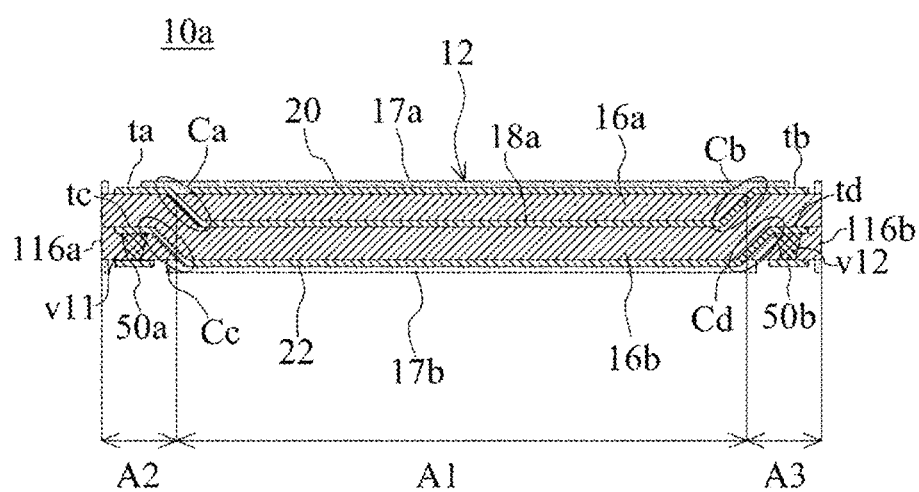
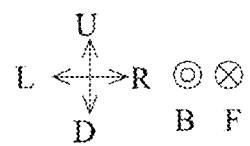

Fig.8
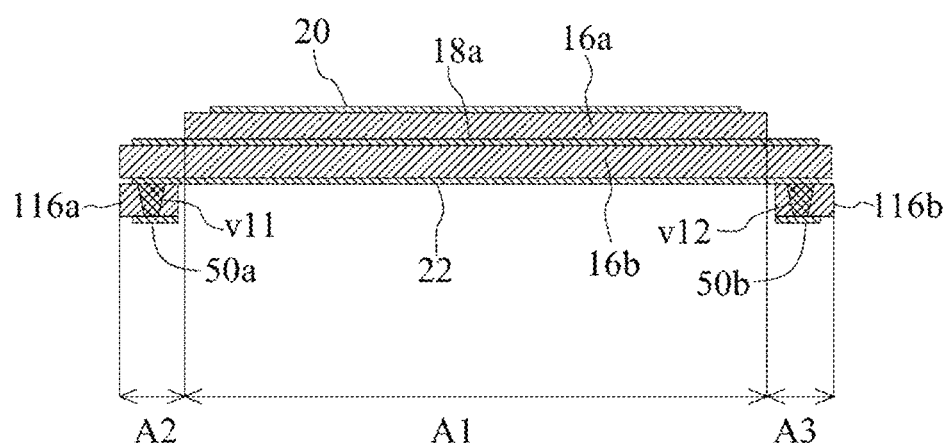
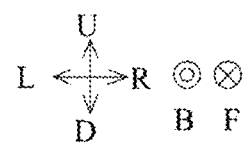

Fig.9
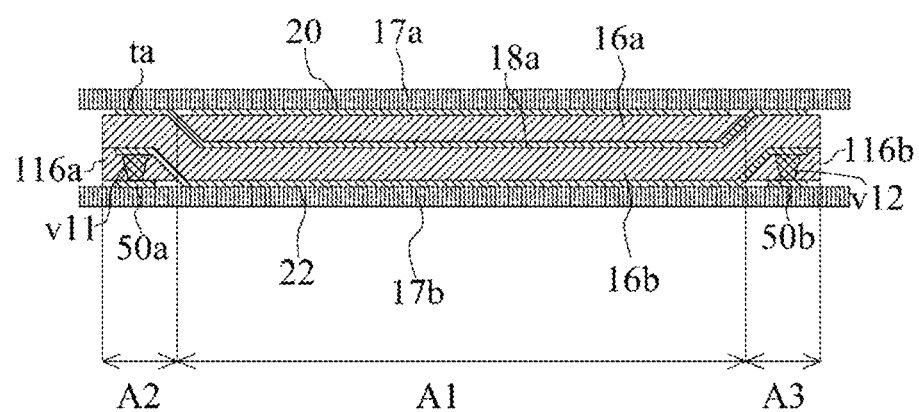
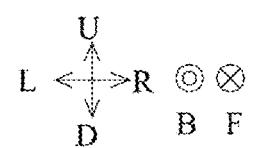

Fig.10
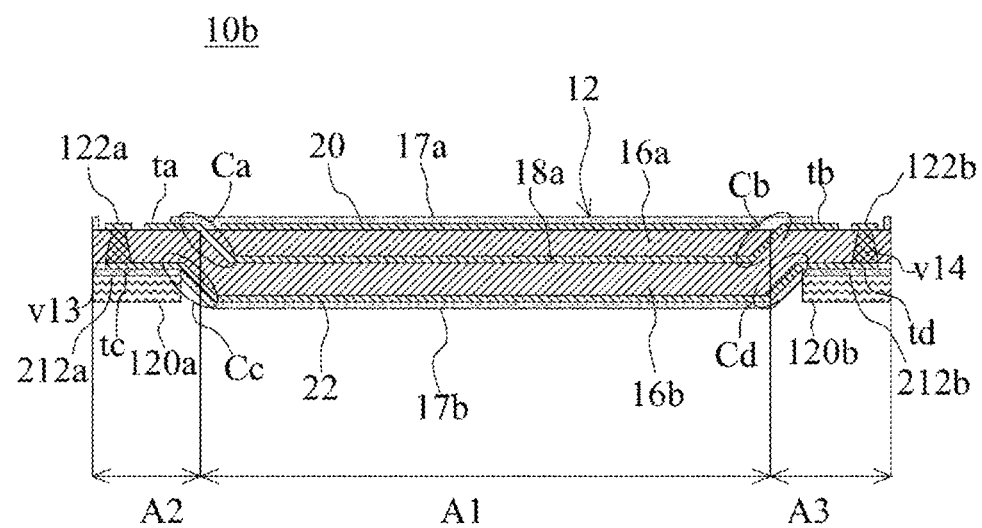
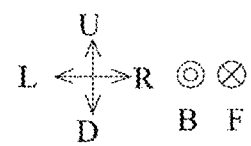

Fig.11
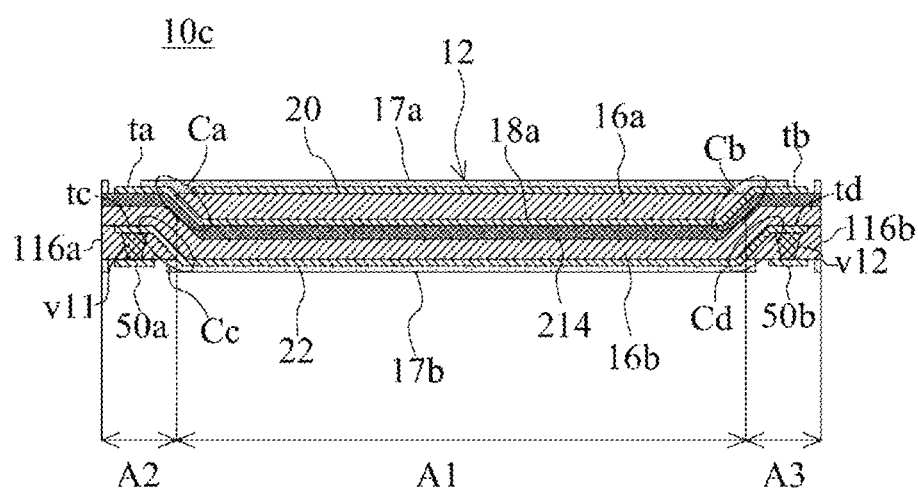
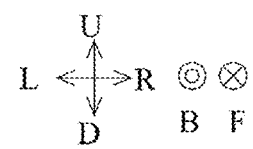

Fig.12
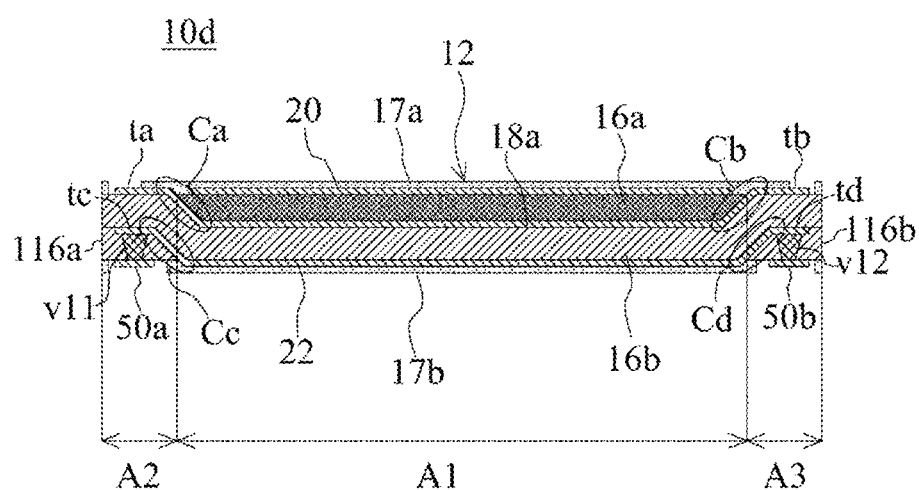
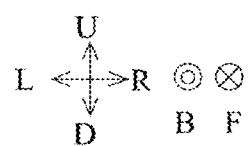

Fig.13
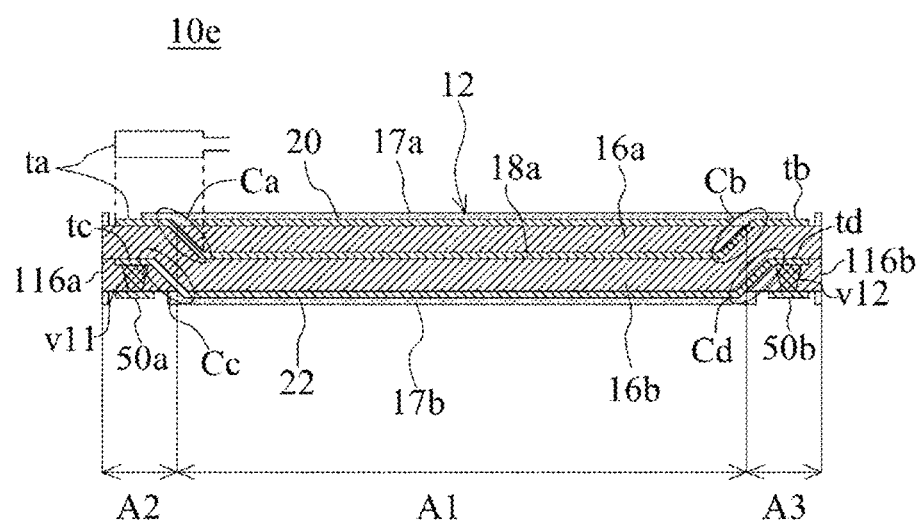
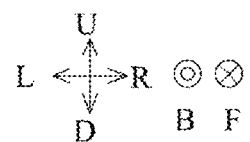

Fig.14
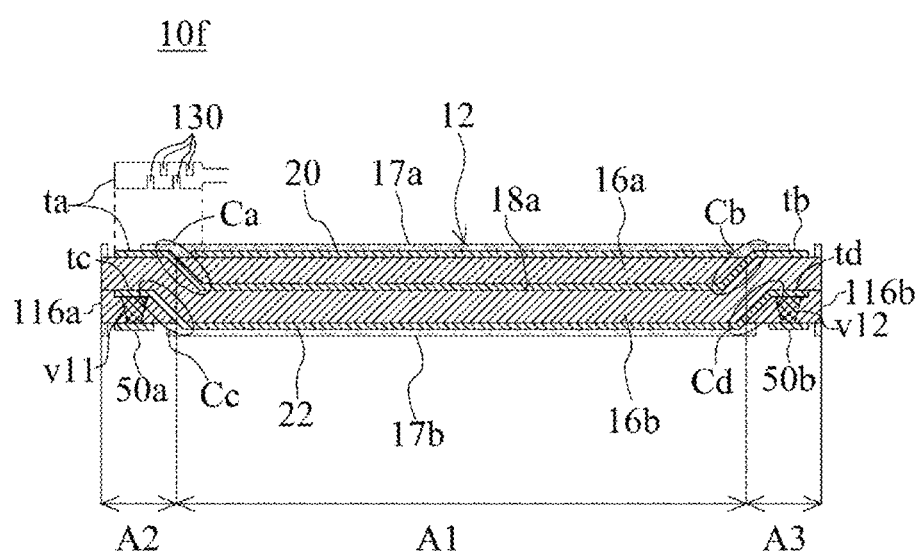
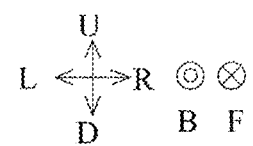

Fig.15
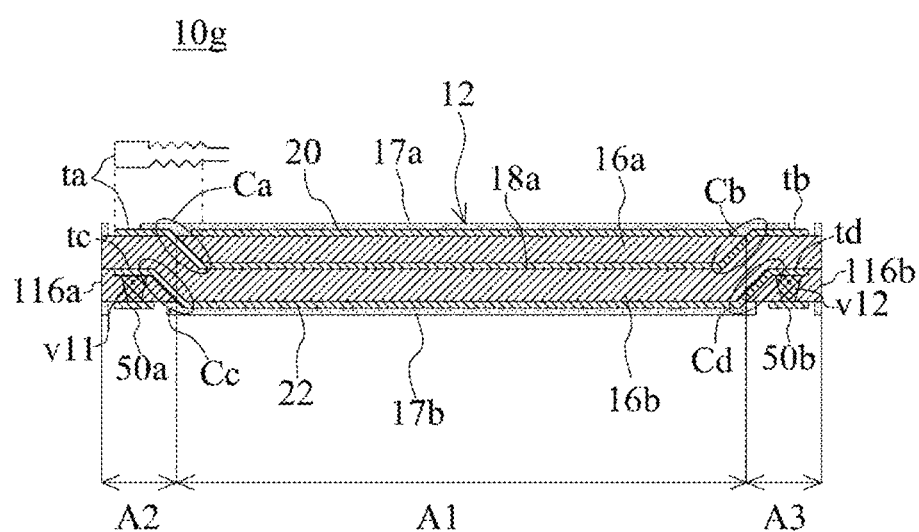
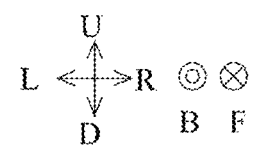

Fig.17
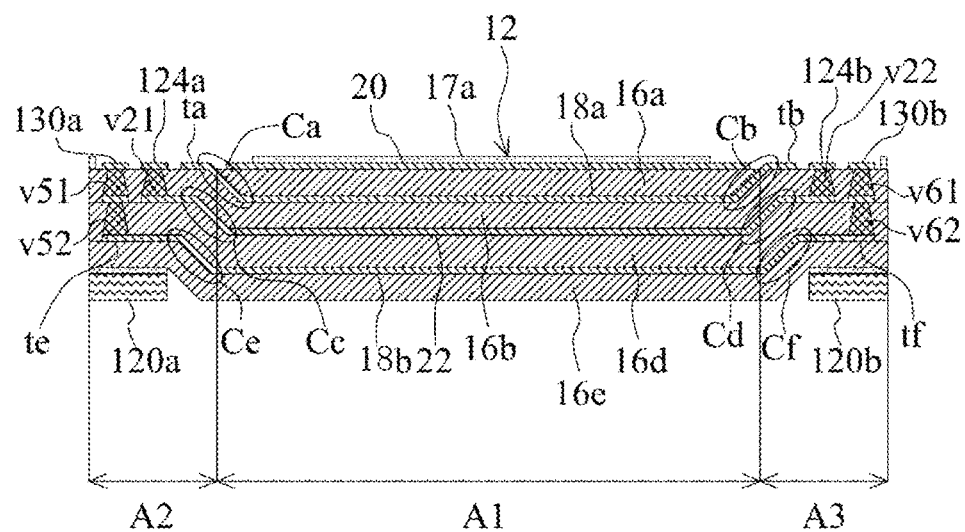
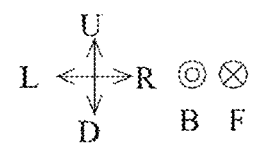

Fig.18
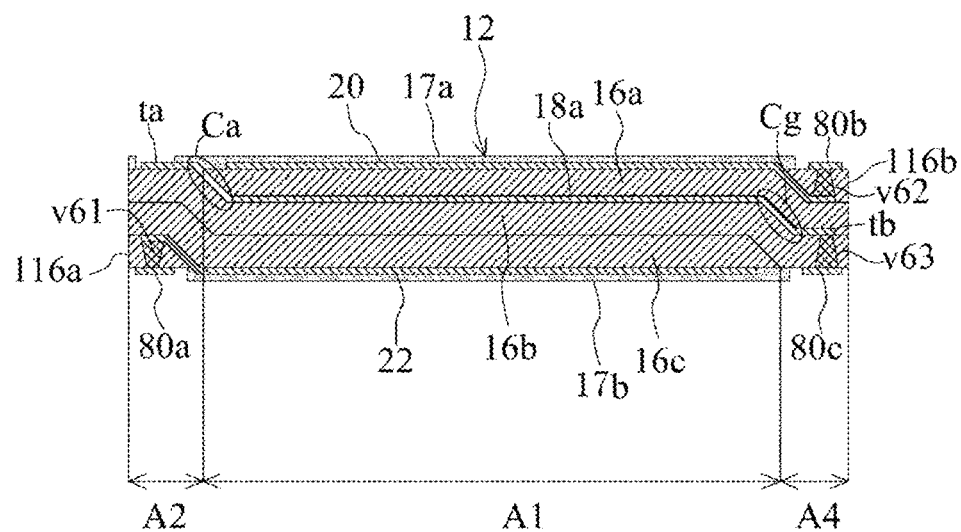
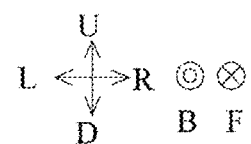

Fig.19
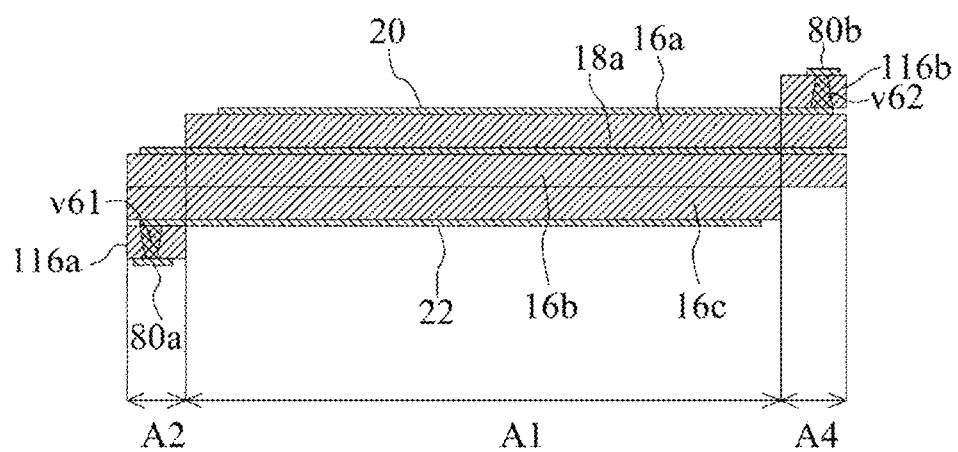
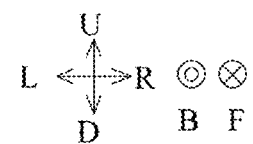

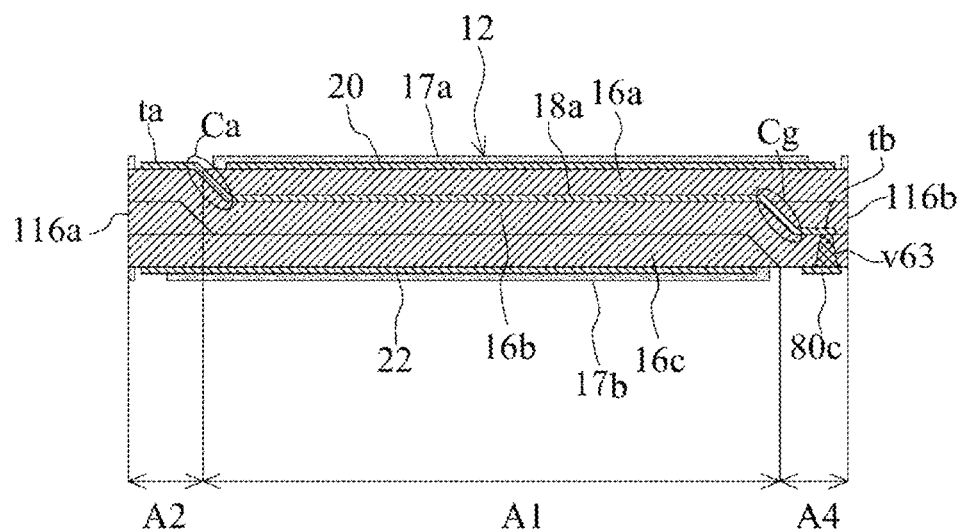
Fig.20
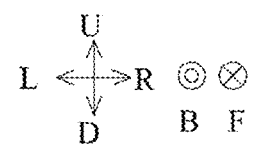

Fig.21
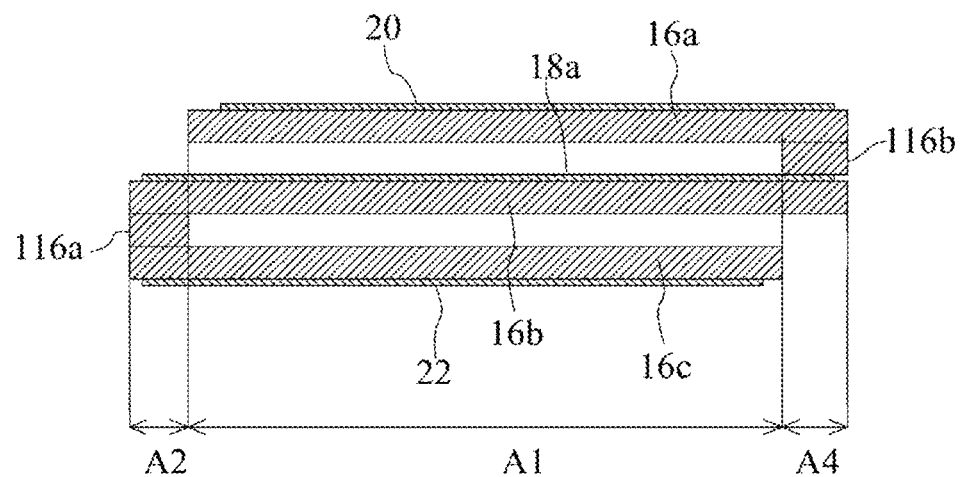
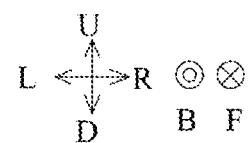

CIRCUIT BOARD AND METHOD OF MANUFACTURING CIRCUIT BOARD

CROSS REFERENCE TO RELATED APPLICATIONS

This application claims the benefit of priority to Japanese Patent Application No. 2020-172347 filed on Oct. 13, 2020 and is a Continuation Application of PCT Application No. PCT/JP2021/033730 filed on Sep. 14, 2021. The entire contents of each application are hereby incorporated herein by reference.

BACKGROUND OF THE INVENTION

1. Field of the Invention

The present invention relates to a circuit board having a structure in which a first resin layer and a second resin layer are laminated, and a method of manufacturing thereof.

2. Description of the Related Art

As an invention related to a conventional circuit board, a transmission line described in Japanese Patent No. 6048633 is known. The transmission line includes a laminated insulator, a signal conductor pattern, a connector connection electrode, and a plurality of interlayer connection conductors. The laminated insulator has a structure in which a plurality of insulator layers are laminated. The signal conductor pattern is provided on an upper main surface of the insulator layer. The signal conductor pattern is provided inside the laminated insulator. The connector connection electrode is provided on the upper main surface of the laminated insulator. The plurality of interlayer connection conductors are connected in series. The plurality of interlayer connection conductors connect an end portion of the signal conductor pattern and the connector connection electrode.

SUMMARY OF THE INVENTION

Incidentally, in the transmission line described in Japanese Patent No. 6048633, a characteristic impedance tends to vary in the plurality of interlayer connection conductors. More specifically, since the plurality of interlayer connection conductors are connected in series, conductor patterns for connection are provided among the plurality of interlayer connection conductors. Such a conductor pattern for connection is likely to form a capacitance with a conductor pattern around the interlayer connection conductor. Thus, a variation in characteristic impedance may occur in the plurality of interlayer connection conductors. Such a variation in characteristic impedance causes reflection of a high frequency signal.

Accordingly, preferred embodiments of the present invention provide circuit boards each capable of reducing reflection of a high frequency signal and methods of manufacturing the circuit boards.

A circuit board according to a preferred embodiment of the present invention includes a board main body including a first resin layer and a second resin layer laminated below the first resin layer, and a first signal conductor layer on an upper main surface of the second resin layer, wherein the first resin layer and the second resin layer are in contact with each other, the first resin layer and the second resin layer include thermoplastic resin, the board main body includes an overlapping region in which the first resin layer and the second resin layer are present when viewed in an up-down direction, and a first non-overlapping region in which the first resin layer is not present and the second resin layer is present when viewed in the up-down direction, the first signal conductor layer includes a first curved portion in which the first signal conductor layer is curved in the up-down direction such that the first signal conductor layer in the first non-overlapping region is positioned above the first signal conductor layer in the overlapping region, and the first signal conductor layer is electrically connectable to a first member on the board main body in the first non-overlapping region.

A method of manufacturing a circuit board according to a preferred embodiment of the present invention includes a first preparing process of preparing a first resin layer including thermoplastic resin, a second preparing process of preparing a second resin layer including thermoplastic resin, the second resin layer including an upper main surface on which a first signal conductor layer is provided, a disposing process of disposing the first resin layer and the second resin layer such that an overlapping region in which the first resin layer and the second resin layer are arranged in this order in a direction from top to bottom, the first resin layer and the second resin layer are in contact with each other, and the first resin layer is located on the second resin layer when viewed in an up-down direction, and a first non-overlapping region in which the first resin layer is not located on the second resin layer when viewed in the up-down direction are formed, and a thermocompression bonding process of thermocompression-bonding the first resin layer and the second resin layer to each other and curving the first signal conductor layer in the up-down direction such that the first signal conductor layer in the first non-overlapping region is positioned above the first signal conductor layer in the overlapping region.

According to circuit boards of preferred embodiments of the present invention, reflection of a high frequency signal can be reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is an external perspective view of a circuit board 10.

FIG. 2 is a cross-sectional view of the circuit board 10 taken along a line A-A in FIG. 1.

FIG. 3 is an exploded perspective view of the circuit board 10.

FIG. 5 is a cross-sectional view of the circuit board 10 in manufacturing.

FIG. 6 is a cross-sectional view of the circuit board 10 in manufacturing.

FIG. 7 is a cross-sectional view of a circuit board 10a.

FIG. 8 is a cross-sectional view of the circuit board 10a in manufacturing.

FIG. 9 is a cross-sectional view of the circuit board 10a in manufacturing.

FIG. 10 is a cross-sectional view of a circuit board 10b.

FIG. 11 is a cross-sectional view of a circuit board 10c.

FIG. 12 is a cross-sectional view of a circuit board 10d.

FIG. 13 is a cross-sectional view of a circuit board 10e.
FIG. 14 is a cross-sectional view of a circuit board 10f.
FIG. 15 is a cross-sectional view of a circuit board 10g.
FIG. 17 is a cross-sectional view of a circuit board 10i.
FIG. 18 is a cross-sectional view of a circuit board 10j.
FIG. 19 is a cross-sectional view of the circuit board 10j in manufacturing.
FIG. 20 is a cross-sectional view of a circuit board 10k.
FIG. 21 is a cross-sectional view of the circuit board 10k in manufacturing.
FIG. 22 is a top view of a first signal conductor layer 18a.

DETAILED DESCRIPTION OF THE PREFERRED EMBODIMENTS

Preferred Embodiments

Structure of Circuit Board 10

Figure 4:
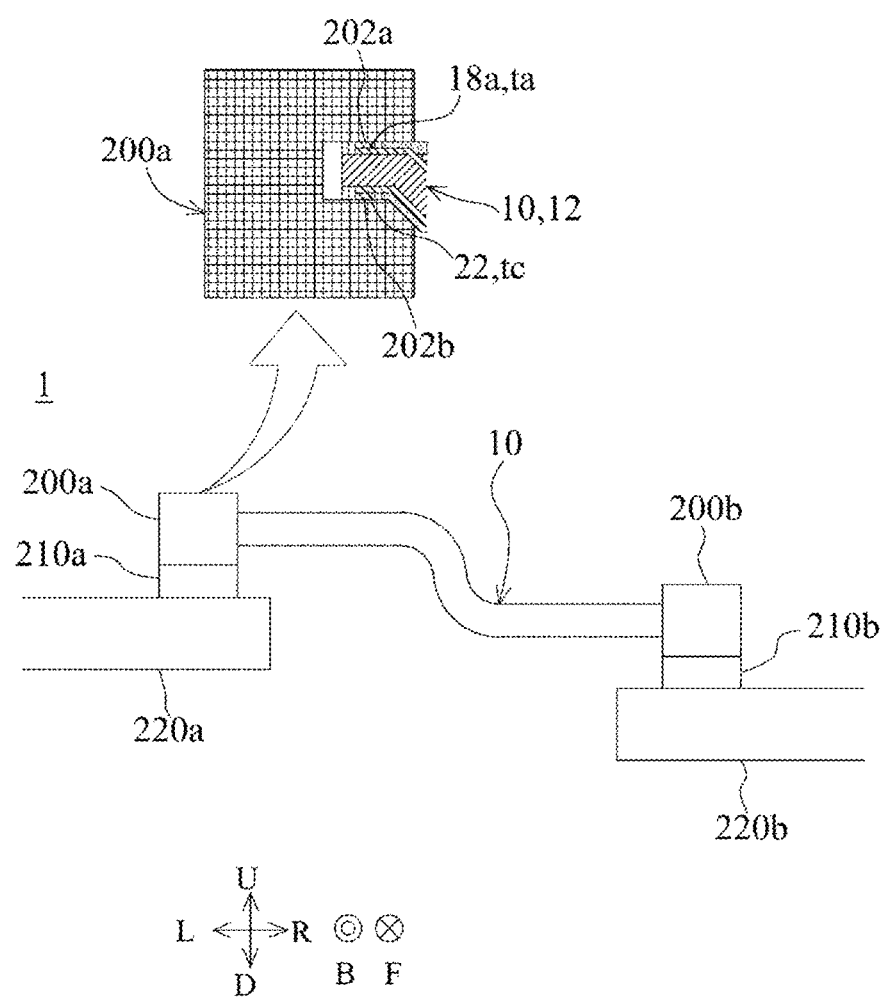
FIG. 4 is a diagram illustrating an electronic device 1 including the circuit board 10.

Hereinafter, a circuit board 10 according to a preferred embodiment of the present invention will be described with reference to the drawings. FIG. 1 is an external perspective view of the circuit board 10. FIG. 2 is a cross-sectional view of the circuit board 10 taken along the line A-A in FIG. 1. FIG. 3 is an exploded perspective view of the circuit board 10.

In the present specification, directions will be defined as follows. A laminating direction of a board main body 12 is defined as an up-down direction. A longer direction of the board main body 12 is defined as a left-right direction. A shorter direction of the board main body 12 is defined as a front-back direction. The up-down direction, the front-back direction, and the left-right direction are orthogonal to each other. Note that the definition of the directions in the present specification is an example. Thus, directions of the board main body 12 in actual use do not need to coincide with the directions in the present specification.

Hereinafter, definitions of terms in the present specification will be described. First, positional relationships between members in the present specification will be defined. X to Z are members or components of the circuit board 10. In the present specification, X and Y aligned in the front-back direction indicate the following state. When X and Y are viewed in a direction perpendicular to the front-back direction, both X and Y are arranged on a freely selected straight line indicating the front-back direction. In the present specification, X and Y that are aligned in the front-back direction when viewed in the up-down direction indicate the following state. When X and Y are viewed in the up-down direction, both X and Y are disposed on a freely selected straight line indicating the front-back direction. In this case, when X and Y are viewed from the left-right direction different from the up-down direction, one of X and Y does not need to be disposed on a freely selected straight line indicating the front-back direction. Note that X and Y may be in contact with each other. X and Y may be separated. Z may be present between X and Y. This definition is also applied to the up-down direction and the left-right direction.

In the present specification, the expression "X is placed before Y" refers to the following state. At least a portion of X is disposed within a region through which Y passes when Y is moved in parallel in a front direction. Thus, X may fall within the region through which Y passes when Y is moved in parallel in the front direction, or may protrude from the region through which Y passes when Y is moved in parallel in the front direction. In this case, X and Y are aligned in the front-back direction. This definition is also applied to the up-down direction and the left-right direction.

In the present specification, the expression "X is disposed before Y when viewed in the left-right direction" refers to the following state. X and Y are aligned in the front-back direction when viewed in the left-right direction, and a portion of X facing Y is disposed before Y when viewed in the left-right direction. In this definition, X and Y do not need to be aligned in the front-back direction in three dimensions. This definition is also applied to the up-down direction and the left-right direction.

In the present specification, the expression "X is disposed before Y" refers to the following state. X is disposed before a plane passing through a front end of Y and being orthogonal to the front-back direction. In this case, X and Y may be aligned in the front-back direction, or do not need to be aligned in the front-back direction. This definition is also applied to the up-down direction and the left-right direction.

In the present specification, unless otherwise specified, each portion of X will be defined as follows. A front portion of X means the front half of X. A back portion of X means the back half of X. A left portion of X means the left half of X. A right portion of X means the right half of X. An upper portion of X means the upper half of X. A lower portion of X means the lower half of X. A front end of X means an end of X in the front direction. A back end of X means an end of X in the back direction. A left end of X means an end of X in the left direction. A right end of X means an end of X in the right direction. An upper end of X means an end of X in the upper direction. A lower end of X means an end of X in the lower direction. A front end portion of X means the front end of X and the vicinity thereof. A back end portion of X means the back end of X and the vicinity thereof. A left end portion of X means the left end of X and the vicinity thereof. A right end portion of X means the right end of X and the vicinity thereof. An upper end portion of X means the upper end of X and the vicinity thereof. A lower end portion of X means the lower end of X and the vicinity thereof.

When two freely selected members in the present specification are defined as X and Y, a relationship between the two freely selected members has the following meaning. In the present specification, the expression "X is supported by Y" includes a case where X is attached to Y so as not to be movable with respect to Y (that is, in a fixed state) and a case where X is attached to Y so as to be movable with respect to Y. In addition, the case where X is supported by Y includes both a case where X is directly attached to Y and a case where X is attached to Y with Z interposed therebetween.

In the present specification, the expression "X and Y are electrically connected" means that electricity is conducted between X and Y. Thus, X and Y may be in contact with each other, or do not need to be in contact with each other. When X and Y are not in contact with each other, Z having conductivity is disposed between X and Y.

In the present specification, the term "curved" means that a resin layer is bent, and includes the meaning of the term "bent".

The circuit board 10 is a high frequency signal transmission line that electrically connects two electric circuits. As illustrated in FIG. 1, the circuit board 10 has a thin plate shape. The circuit board 10 has flexibility. Thus, the circuit board 10 can be bent in the upper direction or the lower direction. As illustrated in FIG. 2 and FIG. 3, the circuit board 10 includes the board main body 12, a first signal conductor layer 18a, a first ground conductor layer 20, a second ground conductor layer 22, and interlayer connection conductors v1 and v2.

As illustrated in FIG. 1, the board main body 12 has a thin plate shape. The board main body 12 has a band shape extending in the left-right direction when viewed in the up-down direction. The board main body 12 includes an upper main surface and a lower main surface. The upper main surface of the board main body 12 is the main surface positioned on the upper side of the two main surfaces of the board main body 12. The lower main surface of the board main body 12 is the main surface positioned on the lower side of the two main surfaces of the board main body 12.

As illustrated in FIG. 2 and FIG. 3, the board main body 12 includes a protection layer 17a, a resin layer 16a (first resin layer), a resin layer 16b (second resin layer), and a protection layer 17b. The board main body 12 has a structure in which the protection layer 17a, the resin layers 16a and 16b, and the protection layer 17b are laminated in this order from top to bottom in the up-down direction. That is, the board main body 12 includes the resin layer 16a (first resin layer) and the resin layer 16b (second resin layer) laminated below the resin layer 16a (first resin layer).

The resin layer 16a includes an upper main surface and a lower main surface. The upper main surface of the resin layer 16a is the main surface positioned at the upper side of the two main surfaces of the resin layer 16a. The lower main surface of the resin layer 16a is the main surface positioned at the lower side of the two main surfaces of the resin layer 16a. The resin layer 16b includes an upper main surface and a lower main surface. The upper main surface of the resin layer 16b is the main surface positioned at the upper side of the two main surfaces of the resin layer 16b. The lower main surface of the resin layer 16b is the main surface positioned at the lower side of the two main surfaces of the resin layer 16b. Thus, the resin layer 16a and the resin layer 16b are in contact with each other. That is, the lower main surface of the resin layer 16a and the upper main surface of the resin layer 16b are in contact with each other.

A length of the resin layer 16b in the left-right direction is longer than a length of the resin layer 16a in the left-right direction. Thus, as illustrated in FIG. 2, the board main body 12 includes an overlapping region A1, a first non-overlapping region A2, and a second non-overlapping region A3. The overlapping region A1 is a region where the resin layer 16a and the resin layer 16b are present when viewed in the up-down direction. Thus, in the overlapping region A1, the resin layer 16a and the resin layer 16b overlap each other when viewed in the up-down direction. The first non-overlapping region A2 and the second non-overlapping region A3 are regions where the resin layer 16a does not exist and the resin layer 16b exists when viewed in the up-down direction. Thus, in the first non-overlapping region A2 and the second non-overlapping region A3, the resin layer 16a does not overlap the resin layer 16b. The first non-overlapping region A2 is positioned at the left side of the overlapping region A1. The second non-overlapping region A3 is positioned at the right side of the overlapping region A1.

Additionally, as illustrated in FIG. 2, the resin layer 16b in the first non-overlapping region A2 is positioned above the resin layer 16b in the overlapping region A1. Thus, the resin layer 16b is curved in the up-down direction in the vicinity of the boundary between the overlapping region A1 and the first non-overlapping region A2. Similarly, the resin layer 16b in the second non-overlapping region A3 is positioned above the resin layer 16b in the overlapping region A1. Thus, the resin layer 16b is curved in the up-down direction in the vicinity of the boundary between the overlapping region A1 and the second non-overlapping region A3. Thus, a position in the up-down direction of the upper main surface of the resin layer 16b in the first non-overlapping region A2 and the second non-overlapping region A3 is substantially coincident with a position in the up-down direction of the upper main surface of the resin layer 16a in the overlapping region A1. That is, the upper main surface of the resin layer 16a (first resin layer) in the overlapping region A1 and the upper main surface of the resin layer 16b (second resin layer) in the first non-overlapping region A2 and the second non-overlapping region A3 are positioned on the same plane.

In addition, the thickness of the resin layer 16a decreases in a direction approaching the first non-overlapping region A2 from the overlapping region A1. That is, the thickness of the left end portion of the resin layer 16a decreases toward the left direction. Similarly, the thickness of the resin layer 16a decreases in a direction approaching the second non-overlapping region A3 from the overlapping region A1. That is, the thickness of the right end portion of the resin layer 16a decreases toward the right direction.

The resin layers 16a and 16b include thermoplastic resin. A material of the resin layer 16a and a material of the resin layer 16b are the same. The thermoplastic resin is, for example, a liquid crystal polymer (LCP), polyimide, or the like. The protection layers 17a and 17b will be described later. The board main body 12, as described above, has flexibility.

The first signal conductor layer 18a is provided in the board main body 12. The first signal conductor layer 18a is provided on the upper main surface of the resin layer 16b. The first signal conductor layer 18a is provided with the overlapping region A1, the first non-overlapping region A2, and the second non-overlapping region A3. The first signal conductor layer 18a has a linear shape including a first end portion ta and a second end portion tb. The first signal conductor layer 18a extends in the left-right direction. Thus, the first end portion ta is the left end portion. The second end portion tb is the right end portion. The first end portion ta is positioned in the first non-overlapping region A2. In the first non-overlapping region A2, the resin layer 16a is not present over the resin layer 16b. Thus, the first end portion ta is positioned at the upper main surface of the board main body 12. Thus, the first end portion ta functions as a first signal electrode. The second end portion tb is positioned in the second non-overlapping region A3. In the second non-overlapping region A3, the resin layer 16a is not present over the resin layer 16b. Thus, the second end portion tb is positioned at the upper main surface of the board main body 12. Thus, the second end portion tb functions as a second signal electrode.

The first signal conductor layer 18a includes a first curved portion Ca in which the first signal conductor layer 18a is curved in the up-down direction such that the first signal conductor layer 18a in the first non-overlapping region A2 is positioned above the first signal conductor layer 18a in the overlapping region A1. More specifically, the first signal conductor layer 18a is provided on the upper main surface of the resin layer 16b. As described above, the resin layer 16b is curved in the up-down direction in the vicinity of the boundary between the overlapping region A1 and the first non-overlapping region A2. Thus, the first signal conductor layer 18a is also curved in the up-down direction in the vicinity of the boundary between the overlapping region A1 and the first non-overlapping region A2.

The first signal conductor layer 18a includes a second curved portion Cb in which the first signal conductor layer 18a is curved in the up-down direction such that the first signal conductor layer 18a in the second non-overlapping region A3 is positioned above the first signal conductor layer 18a in the overlapping region A1. More specifically, the first signal conductor layer 18a is provided on the upper main surface of the resin layer 16b. As described above, the resin layer 16b is curved in the up-down direction in the vicinity of the boundary between the overlapping region A1 and the second non-overlapping region A3. Thus, the first signal conductor layer 18a is also curved in the up-down direction in the vicinity of the boundary between the overlapping region A1 and the second non-overlapping region A3.

The first ground conductor layer 20 is provided in the board main body 12. In the present preferred embodiment, the first ground conductor layer 20 is provided on the upper main surface of the resin layer 16a. Thus, the first ground conductor layer 20 is disposed over the first signal conductor layer 18a. As illustrated in FIG. 3, the first ground conductor layer 20 has a band shape extending in the left-right direction.

The second ground conductor layer 22 is provided in the board main body 12. In the present preferred embodiment, the second ground conductor layer 22 is provided at the lower main surface of the resin layer 16b. Thus, the second ground conductor layer 22 is disposed below the first signal conductor layer 18a. As illustrated in FIG. 3, the second ground conductor layer 22 has a band shape extending in the left-right direction. As described above, the first ground conductor layer 20 and the second ground conductor layer 22 overlap the first signal conductor layer 18a when viewed in the up-down direction. Thus, the first signal conductor layer 18a, the first ground conductor layer 20, and the second ground conductor layer 22 define a strip line structure.

The second ground conductor layer 22 includes end portions tc and td. The end portion tc is a left end portion. The end portion td is a right end portion. The end portion tc is positioned in the first non-overlapping region A2. The end portion tc is exposed to the outside from the board main body 12. Thus, the end portion tc functions as a first ground electrode. The end portion td is positioned in the second non-overlapping region A3. The end portion td is exposed to the outside from the board main body 12. Thus, the end portion td functions as a second ground electrode.

Additionally, the second ground conductor layer 22 includes a third curved portion Cc in which the second ground conductor layer 22 is curved in the up-down direction such that the second ground conductor layer 22 in the first non-overlapping region A2 is positioned above the second ground conductor layer 22 in the overlapping region A1. More specifically, the second ground conductor layer 22 is provided at the lower main surface of the resin layer 16b. As described above, the resin layer 16b is curved in the up-down direction in the vicinity of the boundary between the overlapping region A1 and the first non-overlapping region A2. Thus, the second ground conductor layer 22 is also curved in the up-down direction in the vicinity of the boundary between the overlapping region A1 and the first non-overlapping region A2.

Further, the second ground conductor layer 22 includes a curved portion Cd in which the second ground conductor layer 22 is curved in the up-down direction such that the second ground conductor layer 22 in the second non-overlapping region A3 is positioned above the second ground conductor layer 22 in the overlapping region A1. More specifically, the second ground conductor layer 22 is provided at the lower main surface of the resin layer 16b. As described above, the resin layer 16b is curved in the up-down direction in the vicinity of the boundary between the overlapping region A1 and the second non-overlapping region A3. Thus, the second ground conductor layer 22 is also curved in the up-down direction in the vicinity of the boundary between the overlapping region A1 and the second non-overlapping region A3. The first signal conductor layer 18a, the first ground conductor layer 20, and the second ground conductor layer 22, which have been described above, are formed by, for example, performing patterning on a metal foil made of copper or the like on a resin layer.

The plurality of interlayer connection conductors v1 and v2 electrically connect the first ground conductor layer 20 and the second ground conductor layer 22. More specifically, a plurality of interlayer connection conductors v1 are provided in front of the first signal conductor layer 18a. The plurality of interlayer connection conductors v1 are aligned in a row at equal intervals or substantially equal intervals in the left-right direction. The plurality of interlayer connection conductors v2 are provided in back of the first signal conductor layer 18a. The plurality of interlayer connection conductors v2 are aligned in a row at equal intervals in the left-right direction. The plurality of interlayer connection conductors v1 and v2 pass through the resin layers 16a and 16b in the up-down direction. Upper ends of the plurality of interlayer connection conductors v1 and v2 are connected to the first ground conductor layer 20. Lower ends of the plurality of interlayer connection conductors v1 and v2 are connected to the second ground conductor layer 22. The plurality of interlayer connection conductors v1 and v2 described above are, for example, via hole conductors. The interlayer connection conductors v1 and v2 are formed by filling through holes formed in the resin layers 16a and 16b with conductive paste and sintering the conductive paste.

The protection layer 17a is a resist layer covering the upper main surface of the resin layer 16a and the upper main surface of the resin layer 16b. More precisely, the protection layer 17a extends over the overlapping region A1 and the first non-overlapping region A2, and extends over the overlapping region A1 and the second non-overlapping region A3. The protection layer 17a covers a portion of the upper main surface of the resin layer 16a in the first non-overlapping region A2 and the second non-overlapping region A3. However, the protection layer 17a does not cover the first end portion ta and the second end portion tb of the first signal conductor layer 18a. Thus, the first end portion ta and the second end portion tb of the first signal conductor layer 18a are entirely exposed from the protection layer 17a. Further, the protection layer 17a covers the upper main surface of the resin layer 16b in the overlapping region A1. Thus, the protection layer 17a covers the first ground conductor layer 20. The protection layer 17a protects the first ground conductor layer 20.

The protection layer 17b is a resist layer covering the lower main surface of the resin layer 16b. Thus, the protection layer 17b covers the second ground conductor layer 22. However, a portion of the second ground conductor layer 22 is exposed from the protection layer 17b. The protection layer 17b protects the second ground conductor layer 22. The protection layers 17a and 17b as described above are formed by printing an insulating material. Note that the protection layers 17a and 17b may be coverlay film layers.

In the circuit board 10 as described above, the thicknesses (sizes in the up-down direction) of the board main body 12 in the first non-overlapping region A2 and the second non-overlapping region A3 are thinner (smaller) than the thickness (size in the up-down direction) of the board main body 12 in the overlapping region A1.

Structure of Electronic Device 1

Next, a structure of the electronic device 1 including the circuit board 10 will be described. FIG. 4 is a diagram illustrating the electronic device 1 including the circuit board 10. In addition, FIG. 4 also illustrates a cross-sectional view of the left end portion of the circuit board 10 and a connector 200a.

The electronic device 1 is, for example, a portable communication terminal such as a smartphone. As illustrated in FIG. 4, the electronic device 1 includes the circuit board 10, connectors 200a, 200b, 210a, and 210b, and circuit boards 220a and 220b. The left end portion of the circuit board 10 is inserted into the connector 200a. The right end portion of the circuit board 10 is inserted into the connector 200b.

The connectors 210a and 210b are mounted on the upper main surfaces of the circuit boards 220a and 220b, respectively. The connectors 210a and 210b are connected to the connectors 200a and 200b, respectively. Thus, the circuit boards 220a and 220b are electrically connected to each other through the circuit board 10.

Here, the connection between the left end portion of the circuit board 10 and the connector 200a will be described. The connector 200a includes a signal terminal 202a and a ground terminal 202b. When the left end portion of the circuit board 10 is inserted into the connector 200a, the signal terminal 202a (first member) is disposed on the board main body 12. The ground terminal 202b (second member) is disposed below the board main body 12. More precisely, the signal terminal 202a is disposed on the first end portion ta of the first signal conductor layer 18a. The ground terminal 202b is disposed under the end portion tc of the second ground conductor layer 22. Then, the first signal conductor layer 18a is electrically connected to the signal terminal 202a in the first non-overlapping region A2. The first ground conductor layer 20 is electrically connected to the ground terminal 202b in the first non-overlapping region A2. In the present preferred embodiment, the first end portion ta of the first signal conductor layer 18a is electrically connectable to the signal terminal 202a in the first non-overlapping region A2. Similarly, the end portion tc of the first ground conductor layer 20 is electrically connectable to the ground terminal 202b in the first non-overlapping region A2.

Note that since the connection between the right end portion of the circuit board 10 and the connector 200b is the same as the connection between the left end portion of the circuit board 10 and the connector 200a, description thereof will be omitted.

Note that the connector 200a may be electrically connected to the first signal conductor layer 18a by being mounted on the upper main surface of the board main body 12. In this case, the connector 200a is connected to the connector 210a mounted on the circuit board 220a. At this time, the connector 210a is positioned on the connector 200a. In addition, the first end portion to of the first signal conductor layer 18a may be mounted on the circuit board 220a with solder without using the connectors 200a and 210a.

Method of Manufacturing Circuit Board 10

Next, a method of manufacturing the circuit board 10 will be described with reference to the drawings. FIG. 5 and FIG. 6 are cross-sectional views of the circuit board 10 in manufacturing. Note that in the present preferred embodiment, a method of manufacturing one circuit board 10 will be described. However, in practice, large-sized mother resin layers are laminated and subjected to thermocompression bonding to form a mother circuit board, and the mother circuit board is cut into a plurality of circuit boards 10.

First, the resin layer 16a is prepared by using thermoplastic resin as its material (a first preparing process). To be more specific, the resin layer 16a whose upper main surface is bonded with a metal foil made of copper or the like is prepared. Then, the first ground conductor layer 20 is formed on the upper main surface of the resin layer 16a by performing etching on the metal foil by using a mask.

Next, the resin layer 16b including thermoplastic resin, the resin layer 16b including a signal conductor layer on the upper main surface of the resin layer 16b, is prepared (a second preparing process). To be specific, the resin layer 16b whose upper main surface and lower main surface are bonded with metal foils made of copper or the like is prepared. Then, the first ground conductor layer 20 and the second ground conductor layer 22 are formed on the upper main surface and the lower main surface of the resin layer 16a, respectively, by performing etching on the two metal foils by using a mask.

Next, as illustrated in FIG. 5, the resin layer 16a and the resin layer 16b are disposed such that the resin layer 16a and the resin layer 16b are arranged in this order from top to bottom, the resin layer 16a and the resin layer 16b are in contact with each other, and the overlapping region A1, the first non-overlapping region A2, and the second non-overlapping region A3 are formed (a disposing process). To be specific, the resin layer 16a is placed over the resin layer 16b such that the left end portion and the right end portion of the resin layer 16b do not overlap the resin layer 16a. Further, in the first non-overlapping region A2, a base 100a is disposed below the resin layer 16b. In the second non-overlapping region A3, a base 100b is disposed below the resin layer 16b.

Next, as illustrated in FIG. 6, the resin layer 16a and the resin layer 16b are thermocompression-bonded to each other to curve the first signal conductor layer 18a in the up-down direction such that the first signal conductor layer 18a in the first non-overlapping region A2 is positioned above the first signal conductor layer 18a in the overlapping region A1 (a thermocompression bonding process). To be more specific, a tool T1 is disposed over the resin layers 16a and 16b and the bases 100a and 100b, and a tool T2 is disposed below the resin layers 16a and 16b and the bases 100a and 100b. Then, while the resin layers 16a and 16b are being heated, the resin layers 16a and 16b are pressed from above and below by using the tools T1 and T2. Thus, the resin layers 16a and 16b are softened by heating and joined to each other. Further, the base 100a pushes up the resin layer 16b in the first non-overlapping region A2. The base 100b pushes up the resin layer 16b in the second non-overlapping region A3.

Finally, the protection layers 17a and 17b are printed on the upper main surface and the lower main surface of the board main body 12, respectively. Through the above processes, the circuit board 10 is completed.

Effects

According to the circuit board 10, reflection of a high frequency signal can be reduced. More specifically, in the transmission line described in Japanese Patent No. 6048633, since a plurality of interlayer connection conductors are connected in series, conductor patterns for connection are provided between the plurality of interlayer connection conductors. Such a conductor pattern for connection is likely to form a capacitance with a conductor pattern around the interlayer connection conductor. Thus, a variation in characteristic impedance may occur in the plurality of interlayer connection conductors. Such a variation in characteristic impedance causes reflection of a high frequency signal.

Thus, in the circuit board 10, the board main body 12 includes the overlapping region A1 in which the resin layer 16a and the resin layer 16b are present when viewed in the up-down direction, and the first non-overlapping region A2 in which the resin layer 16a is not present and the resin layer 16b is present when viewed in the up-down direction. The first signal conductor layer 18a includes the first curved portion Ca in which the first signal conductor layer 18a is curved in the up-down direction such that the first signal conductor layer 18a in the first non-overlapping region A2 is positioned above the first signal conductor layer 18a in the overlapping region A1. Due to this, in the circuit board 10, the first signal conductor layer 18a comes close to the upper main surface of the board main body 12 in the first non-overlapping region A2 without using interlayer connection conductors and conductor patterns for connection that cause a variation in characteristic impedance. Thus, the characteristic impedance is less likely to vary in the first curved portion Ca. As described above, according to the circuit board 10, the reflection of the high frequency signal can be reduced.

According to the circuit board 10, the first end portion to is positioned at the upper main surface of the board main body 12 and functions as a first signal electrode. Thus, interlayer connection conductors and conductor patterns for connection are not used for connection between the first signal electrode and the first signal conductor layer 18a. As a result, according to the circuit board 10, the reflection of the high frequency signal can be further reduced.

According to the circuit board 10, the insertion loss of the circuit board 10 can be reduced. As described above, in the circuit board 10, the first signal conductor layer 18a comes close to the upper main surface of the board main body 12 in the first non-overlapping region A2 without using interlayer connection conductors and conductor patterns for connection. A resistance value per unit length of the first signal conductor layer 18a is generally smaller than a resistance value per unit length of the interlayer connection conductor. As a result, according to the circuit board 10, the insertion loss of the circuit board 10 can be reduced.

According to the circuit board 10, it is possible to reduce or prevent a variation in characteristic impedance of the first signal conductor layer 18a at the first curved portion Ca. More specifically, the second ground conductor layer 22 includes a third curved portion Cc where the second ground conductor layer 22 is curved in the up-down direction such that the second ground conductor layer 22 in the first non-overlapping region A2 is positioned above the second ground conductor layer 22 in the overlapping region A1. Thus, a variation in distance between the first signal conductor layer 18a and the second ground conductor layer 22 is reduced or prevented at the first curved portion Ca. As a result, according to the circuit board 10, it is possible to reduce or prevent a variation in characteristic impedance of the first signal conductor layer 18a at the first curved portion Ca.

According to the method of manufacturing the circuit board 10, it is possible to easily manufacture the circuit board 10 provided with the first signal conductor layer 18a including the first curved portion Ca. More specifically, in the method of manufacturing the circuit board 10, the resin layer 16a and the resin layer 16b are disposed such that the resin layer 16a and the resin layer 16b are aligned in this order from top to bottom, the resin layer 16a and the resin layer 16b are in contact with each other, and the overlapping region A1 and the first non-overlapping region A2 are formed. Then, the first signal conductor layer 18a is curved in the up-down direction such that the first signal conductor layer 18a in the first non-overlapping region A2 is positioned above the first signal conductor layer 18a in the overlapping region A1 by thermocompression-bonding the resin layer 16a and the resin layer 16b. Thus, the first curved portion Ca is formed in the first signal conductor layer 18a. As described above, in the method of manufacturing the circuit board 10, in order to form the first curved portion Ca in the first signal conductor layer 18a, it is only necessary to devise the arrangement of the resin layers 16a and 16b. That is, in the method of manufacturing the circuit board 10, it is not necessary to add a special process in order to form the first curved portion Ca in the first signal conductor layer 18a. As a result, according to the method of manufacturing the circuit board 10, it is possible to easily manufacture the circuit board 10 provided with the first signal conductor layer 18a including the first curved portion Ca.

In the circuit board 10, the protection layer 17a extends across the overlapping region A1 and the first non-overlapping region A2, and also extends across the overlapping region A1 and the second non-overlapping region A3. Due to this, the boundary between the resin layer 16a and the resin layer 16b is covered with the protection layer 17a. As a result, the separation of the resin layer 16a from the resin layer 16b is reduced or prevented.

First Modification

Structure of Circuit Board 10a

Hereinafter, a circuit board 10a according to a first modification will be described with reference to the drawings. FIG. 7 is a cross-sectional view of the circuit board 10a.

The circuit board 10a is different from the circuit board 10 in that the circuit board 10a further includes resin layers 116a and 116b, interlayer connection conductors v11 and v12, and ground electrodes 50a and 50b. Hereinafter, the circuit board 10a will be described focusing on this difference.

The board main body 12 further includes resin layers 116a and 116b. The resin layer 116a is disposed below the resin layer 16b in the first non-overlapping region A2. The resin layer 116b is disposed below the resin layer 16b in the second non-overlapping region A3.

The ground electrodes 50a and 50b are provided at the lower main surfaces of the resin layers 116a and 116b, respectively. The interlayer connection conductors v11 and v12 penetrate the resin layers 116a and 116b in the up-down direction, respectively. The interlayer connection conductor v11 electrically connects the end portion tc of the first ground conductor layer 20 to the ground electrode 50a. The interlayer connection conductor v12 electrically connects the end portion td of the first ground conductor layer 20 to the ground electrode 50b. Note that since the other structures of the circuit board 10a are the same as those of the circuit board 10, description thereof will be omitted.

Method of Manufacturing Circuit Board 10a

Next, a method of manufacturing the circuit board 10a will be described with reference to the drawings. FIG. 8 and FIG. 9 are cross-sectional views of the circuit board 10a in manufacturing.

The method of manufacturing the circuit board 10a is different from that of the circuit board 10 in the disposing process. More specifically, in the disposing process in the method of manufacturing the circuit board 10, the base 100a is disposed below the resin layer 16b in the first non-overlapping region A2. Furthermore, in the second non-overlapping region A3, the base 100b is disposed below the resin layer 16b. On the other hand, in the method of manufacturing the circuit board 10a, as illustrated in FIG. 8, in the disposing process, the resin layer 116a is disposed below the resin layer 16b in the first non-overlapping region A2. Furthermore, the resin layer 116b is disposed below the resin layer 16b in the second non-overlapping region A3. Thereafter, in the thermocompression bonding process illustrated in FIG. 9, the resin layers 116a and 116b are softened by heating and bonded to the resin layer 16b. Since the other processes of the method of manufacturing the circuit board 10a are the same as those of the method of manufacturing the circuit board 10, description thereof will be omitted.

Effects

According to the circuit board 10a, reflection of a high frequency signal can be reduced for the same reason as that of the circuit board 10. According to the circuit board 10a, an insertion loss of the circuit board 10a can be reduced for the same reason as that of the circuit board 10. According to the circuit board 10a, a variation in characteristic impedance of the first signal conductor layer 18a can be reduced or prevented in the first curved portion Ca for the same reason as that of the circuit board 10. According to the method of manufacturing the circuit board 10a, the circuit board 10a provided with the first signal conductor layer 18a including the first curved portion Ca can be easily manufactured for the same reason as that of the method of manufacturing the circuit board 10.

Second Modification

Hereinafter, a circuit board 10b according to a second modification will be described with reference to the drawings. FIG. 10 is a cross-sectional view of the circuit board 10b.

The circuit board 10b is different from the circuit board 10 in that the circuit board 10b further includes reinforcing members 120a and 120b, a first ground electrode 122a, a second ground electrode 122b, and interlayer connection conductors v13 and v14. Hereinafter, the circuit board 10b will be described focusing on this difference.

A reinforcing member 120a (first reinforcing member) is disposed below the resin layer 16b in the first non-overlapping region A2. The reinforcing member 120a is fixed to the lower main surface of the resin layer 16b with an adhesive layer 212a in the first non-overlapping region A2. A lower end of the reinforcing member 120a (first reinforcing member) in the first non-overlapping region A2 is positioned above the lower main surface of the board main body 12 in the overlapping region A1. The reinforcing member 120b (second reinforcing member) is disposed below the resin layer 16b in the second non-overlapping region A3. The reinforcing member 120b is fixed to the lower main surface of the resin layer 16b with an adhesive layer 212b in the second non-overlapping region A3. A lower end of the reinforcing member 120b (second reinforcing member) in the second non-overlapping region A3 is positioned above the lower main surface of the board main body 12 in the overlapping region A1. The reinforcing members 120a and 120b are made of, for example, stainless steel (SUS). The thicknesses of the adhesive layers 212a and 212b are larger than the thicknesses of the protection layers 17a and 17b. The thicknesses of the adhesive layers 212a and 212b are smaller than the thicknesses of the reinforcing members 120a and 120b.

The first ground electrode 122a is provided at the upper main surface of the board main body 12 in the first non-overlapping region A2. That is, the first ground electrode 122a is provided at the upper main surface of the resin layer 16b in the first non-overlapping region A2. The second ground electrode 122b is provided at the upper main surface of the board main body 12 in the second non-overlapping region A3. That is, the second ground electrode 122b is provided at the upper main surface of the resin layer 16b in the second non-overlapping region A3.

The interlayer connection conductors v13 and v14 penetrate the resin layer 16b in the up-down direction in the first non-overlapping region A2 and the second non-overlapping region A3, respectively. The interlayer connection conductor v13 (second interlayer connection conductor) electrically connects the first ground electrode 122a and the second ground conductor layer 22 (the end portion tc of the second ground conductor layer 22). The interlayer connection conductor v14 electrically connects the second ground electrode 122b and the second ground conductor layer 22 (the end portion td of the second ground conductor layer 22). Since the other structures of the circuit board 10b are the same as those of the circuit board 10, description thereof will be omitted.

The method of manufacturing the circuit board 10b is different from that of the circuit board 10 in the disposing process. More specifically, in the disposing process in the method of manufacturing the circuit board 10, the base 100a is disposed below the resin layer 16b in the first non-overlapping region A2. Furthermore, in the second non-overlapping region A3, the base 100b is disposed below the resin layer 16b. On the other hand, in the method of manufacturing the circuit board 10b, in the disposing process, the reinforcing member 120a is disposed below the resin layer 16b in the first non-overlapping region A2. Furthermore, in the second non-overlapping region A3, the reinforcing member 120b is disposed below the resin layer 16b. Thereafter, in the thermocompression bonding process, the reinforcing members 120a and 120b are bonded to the resin layer 16b. Note that since the other processes of the method of manufacturing the circuit board 10b are the same as those of the method of manufacturing the circuit board 10, description thereof will be omitted.

According to the circuit board 10b, reflection of a high frequency signal can be reduced for the same reason as that of the circuit board 10. According to the circuit board 10b, an insertion loss of the circuit board 10b can be reduced for the same reason as that of the circuit board 10. According to the circuit board 10b, a variation in characteristic impedance of the first signal conductor layer 18a can be reduced or prevented at the first curved portion Ca for the same reason as that of the circuit board 10. According to the method of manufacturing the circuit board 10b, the circuit board 10b provided with the first signal conductor layer 18a including the first curved portion Ca can be easily manufactured for the same reason as that of the method of manufacturing the circuit board 10.

The circuit board 10b includes the reinforcing member 120a disposed below the resin layer 16b (second resin layer) in the first non-overlapping region A2. This improves the strength of the first non-overlapping region A2 of the circuit board 10b. As a result, breakage of the circuit board 10b is reduced or prevented. In addition, when a connector is mounted in the first non-overlapping region A2 of the circuit board 10b, removal of the connector from the circuit board 10b is reduced or prevented due to deformation of the circuit board 10b. In addition, unintended deformation of the first non-overlapping region A2 of the circuit board 10b is reduced or prevented.

Note that in the circuit board 10b, the lower surfaces of the reinforcing members 120a and 120b may be positioned below the lower main surface of the protection layer 17b. In this case, the pressure bonding process is facilitated. On the other hand, in the circuit board 10b, the lower surfaces of the reinforcing members 120a and 120b may be located at the same position as that of the lower main surface of the protection layer 17b in the up-down direction. Thus, the flatness of the lower surface of the circuit board 10b is improved. As a result, the size of the circuit board 10b can be reduced.

Third Modification

Hereinafter, a circuit board 10c according to a third modification will be described with reference to the drawings. FIG. 11 is a cross-sectional view of the circuit board 10c.

The circuit board 10c is different from the circuit board 10a in that the circuit board 10c further includes a resin layer 214 (second resin layer). More specifically, the resin layer 214 is provided below the resin layer 16a and above the resin layer 16b. Thus, the resin layer 16a (first resin layer), the resin layer 214 (second resin layer), and the resin layer 16b (fourth resin layer) are laminated in this order from top to bottom in the up-down direction. That is, the board main body 12 includes the resin layer 16a (first resin layer), and the resin layer 214 (second resin layer) laminated below the resin layer 16a (first resin layer). The resin layer 214 functions as an adhesive layer that bonds the resin layer 16a and the resin layer 16b. The dielectric constant of the resin layer 214 is lower than the dielectric constant of the resin layers 16a and 16b, and/or the dielectric loss tangent of the resin layer 214 is lower than the dielectric loss tangent of the resin layers 16a and 16b. The resin layer 214 is bonded to the resin layers 16a and 16b by thermocompression bonding. For example, the main component of the material of the resin layers 16a and 16b is a liquid crystal polymer. The main component of the material of the resin layer 214 is fluororesin (PTFE, PFA, or the like). The main component is a component having the highest proportion among components contained in the material. In such a case, the Young's modulus of the material of the resin layers 16a and 16b is larger than the Young's modulus of the material of the resin layer 214. Thus, deformation of the circuit board 10c is reduced or prevented. Note that since the other structures of the circuit board 10c are the same as those of the circuit board 10a, description thereof will be omitted.

According to the circuit board 10c, reflection of a high frequency signal can be reduced for the same reason as that of the circuit board 10. According to the circuit board 10c, an insertion loss of the circuit board 10c can be reduced for the same reason as that of the circuit board 10. According to the circuit board 10c, a variation in characteristic impedance of the first signal conductor layer 18a can be reduced or prevented at the first curved portion Ca for the same reason as that of the circuit board 10. According to the method of manufacturing the circuit board 10c, the circuit board 10c provided with the first signal conductor layer 18a including the first curved portion Ca can be easily manufactured for the same reason as that in the method of manufacturing the circuit board 10.

According to the circuit board 10c, an insertion loss of the circuit board 10c can be reduced. More specifically, a length of a portion where the first signal conductor layer 18a is in contact with the resin layer 214 is longer than a length of a portion where the first signal conductor layer 18a is in contact with the resin layer 16a. This can effectively reduce the insertion loss of the circuit board 10c when a dielectric loss to be generated in the resin layer 214 is reduced. Thus, the dielectric constant of the resin layer 214 is lower than the dielectric constant of the resin layers 16a and 16b. Thus, according to the circuit board 10c, the insertion loss of the circuit board 10c can be reduced.

Fourth Modification

Hereinafter, a circuit board 10d according to a fourth modification will be described with reference to the drawings. FIG. 12 is a cross-sectional view of the circuit board 10d.

The circuit board 10d differs from the circuit board 10a in the Young's modulus of the material of the resin layer 16a. More specifically, the Young's modulus of the material of the resin layer 16a is larger than the Young's modulus of the material of the resin layer 16b. However, the resin layer 16a and the resin layer 16b are bonded by thermocompression bonding. The main component of the material of the resin layer 16a is the same as the main component of the material of the resin layer 16b. However, in the circuit board 10d, the main component of the material of the resin layer 16a may be different from the main component of the material of the resin layer 16b. In this case, for example, the main component of the material of the resin layer 16a is fluorine resin, and the main component of the material of the resin layer 16b is a liquid crystal polymer. The main component is a component having the highest proportion among components contained in the material. Note that since the other structures of the circuit board 10d are the same as those of the circuit board 10a, description thereof will be omitted.

According to the circuit board 10d, reflection of a high frequency signal can be reduced for the same reason as that of the circuit board 10. According to the circuit board 10d, an insertion loss of the circuit board 10d can be reduced for the same reason as that of the circuit board 10. According to the circuit board 10d, a variation in characteristic impedance of the first signal conductor layer 18a can be reduced or prevented at the first curved portion Ca for the same reason as that of the circuit board 10. According to the method of manufacturing the circuit board 10d, the circuit board 10d provided with the first signal conductor layer 18a including the first curved portion Ca can be easily manufactured for the same reason as that of the method of manufacturing the circuit board 10.

According to the circuit board 10d, the resin layer 16b is easily deformed in the thermocompression bonding process. More specifically, the Young's modulus of the material of the resin layer 16a is larger than the Young's modulus of the material of the resin layer 16b. Thus, in the thermocompression bonding process, the resin layer 16b is pushed downward by the hard resin layer 16a in the overlapping region A1. As a result, according to the circuit board 10d, the resin layer 16b is easily deformed in the thermocompression bonding process. In the present specification, the term "hard" means that the Young's modulus is large.

Fifth Modification

Hereinafter, a circuit board 10e according to a fifth modification will be described with reference to the drawings. FIG. 13 is a cross-sectional view of the circuit board 10e. FIG. 13 also illustrates a top view of the first end portion ta of the first signal conductor layer 18a.

The circuit board 10e differs from the circuit board 10a in the structure of the first end portion ta of the first signal conductor layer 18a. More specifically, line widths of the first curved portion Ca, the second curved portion Cb, the first end portion ta, and the second end portion tb are larger than a line width of the first signal conductor layer 18a in the overlapping region A1. Note that since the other structures of the circuit board 10e are the same as those of the circuit board 10a, description thereof will be omitted.

According to the circuit board 10e, reflection of a high frequency signal can be reduced for the same reason as that of the circuit board 10. According to the circuit board 10e, an insertion loss of the circuit board 10e can be reduced for the same reason as that of the circuit board 10. According to the circuit board 10e, a variation in characteristic impedance of the first signal conductor layer 18a can be reduced or prevented at the first curved portion Ca for the same reason as that of the circuit board 10. According to the method of manufacturing the circuit board 10e, the circuit board 10e provided with the first signal conductor layer 18a including the first curved portion Ca can be easily manufactured for the same reason as that of the method of manufacturing the circuit board 10.

According to the circuit board 10e, a variation in characteristic impedance at the first curved portion Ca and the first end portion ta is reduced or prevented. More specifically, the first signal conductor layer 18a and the first ground conductor layer 20 are not opposed to each other at the first curved portion Ca and the first end portion ta. Due to this, a capacitance value generated in the first signal conductor layer 18a at the first curved portion Ca and the first end portion ta is likely to be smaller than a capacitance value generated in the first signal conductor layer 18a in the overlapping region A1. Thus, the line width of the first curved portion Ca, the line width of the second curved portion Cb, the line width of the first end portion ta, and the line width of the second end portion tb are larger than the line width of the first signal conductor layer 18a in the overlapping region A1. Due to this, the capacitance values generated in the first signal conductor layer 18a at the first curved portion Ca and the first end portion ta approach the capacitance value generated in the first signal conductor layer 18a in the overlapping region A1. As a result, according to the circuit board 10e, a variation in characteristic impedance is reduced or prevented at the first curved portion Ca and the first end portion ta.

Note that in the first signal conductor layer 18a, the line width of the first signal conductor layer 18a discontinuously changes. However, the line width of the first signal conductor layer 18a may continuously change. That is, the first signal conductor layer 18a may have a tapered shape at the right end portion of the first end portion ta.

Sixth Modification

Hereinafter, a circuit board 10f according to a sixth modification will be described with reference to the drawings. FIG. 14 is a cross-sectional view of the circuit board 10f. FIG. 14 also illustrates a top view of the first end portion ta of the first signal conductor layer 18a.

The circuit board 10f is different from the circuit board 10a in the structure of the first curved portion Ca of the first signal conductor layer 18a. More specifically, the first curved portion Ca is provided with a plurality of notches 130 extending in a line width direction. Since the other structures of the circuit board 10f are the same as those of the circuit board 10a, description thereof will be omitted.

The circuit board 10f can reduce reflection of a high frequency signal for the same reason as that of the circuit board 10. According to the circuit board 10f, an insertion loss of the circuit board 10f can be reduced for the same reason as that of the circuit board 10. According to the circuit board 10f, a variation in characteristic impedance of the first signal conductor layer 18a can be reduced or prevented at the first curved portion Ca for the same reason as that of the circuit board 10. According to the method of manufacturing the circuit board 10f, the circuit board 10f provided with the first signal conductor layer 18a including the first curved portion Ca can be easily manufactured for the same reason as that of the method of manufacturing the circuit board 10.

In the circuit board 10f, the first curved portion Ca is provided with the plurality of notches 130 extending in the line width direction. As a result, the first signal conductor layer 18a becomes soft at the first curved portion Ca, and thus, is easily bent in the up-down direction at the first curved portion Ca.

Seventh Modification

Hereinafter, a circuit board 10g according to a seventh modification will be described with reference to the drawings. FIG. 15 is a cross-sectional view of the circuit board 10g. FIG. 15 also illustrates a top view of the first end portion to of the first signal conductor layer 18a.

The circuit board 10g is different from the circuit board 10a in the structure of the first curved portion Ca of the first signal conductor layer 18a. More specifically, the first curved portion Ca has a meander shape when viewed in the up-down direction. Since the other structures of the circuit board 10f are the same as those of the circuit board 10a, description thereof will be omitted.

The circuit board 10g can reduce reflection of a high frequency signal for the same reason as that of the circuit board 10. According to the circuit board 10g, an insertion loss of the circuit board 10g can be reduced for the same reason as that of the circuit board 10. According to the circuit board 10g, a variation in characteristic impedance of the first signal conductor layer 18a can be reduced or prevented at the first curved portion Ca for the same reason as that of the circuit board 10. According to the method of manufacturing the circuit board 10g, the circuit board 10g provided with the first signal conductor layer 18a including the first curved portion Ca can be easily manufactured for the same reason as that of the method of manufacturing the circuit board 10.

In the circuit board 10g, the first curved portion Ca has a meander shape when viewed in the up-down direction. As a result, the first signal conductor layer 18a becomes soft at the first curved portion Ca, and thus, is easily bent in the up-down direction at the first curved portion Ca.

Eighth Modification

Figure 16:
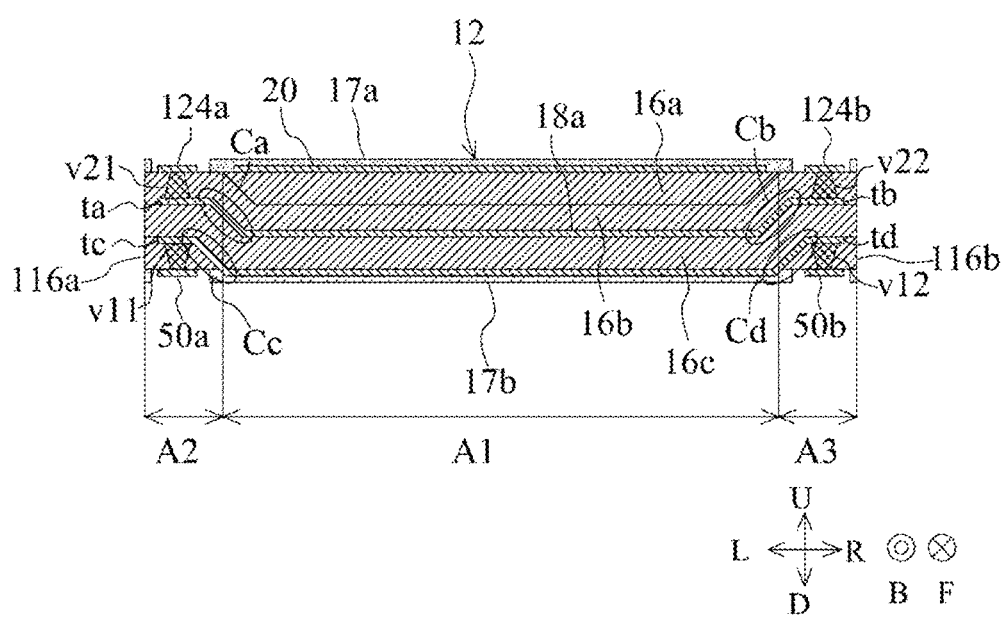
FIG. 16 is a cross-sectional view of a circuit board 10h.

Hereinafter, a circuit board 10h according to an eighth modification will be described with reference to the drawings. FIG. 16 is a cross-sectional view of the circuit board 10h.

The circuit board 10h is different from the circuit board 10a in that the circuit board 10h further includes a resin layer 16c, signal electrodes 124a and 124b, and interlayer connection conductors v21 and v22. Hereinafter, the circuit board 10h will be described focusing on this difference.

The board main body 12 further includes the resin layer 16c. The board main body 12 has a structure in which the protection layer 17a, the resin layer 16a, the resin layer 16b, the resin layer 16c, and the protection layer 17b are laminated in this order from top to bottom. That is, the board main body 12 further includes the resin layer 16c (third resin layer) laminated below the resin layer 16b (second resin layer). The resin layer 16c has the same structure as that of the resin layer 16b. Thus, the resin layer 16c in the first non-overlapping region A2 is positioned below the resin layer 16b in the overlapping region A1. The resin layer 16c is curved in the up-down direction in the vicinity of the boundary between the overlapping region A1 and the first non-overlapping region A2. Similarly, the resin layer 16c in the second non-overlapping region A3 is positioned below the resin layer 16b in the overlapping region A1. The resin layer 16c is curved in the up-down direction in the vicinity of the boundary between the overlapping region A1 and the second non-overlapping region A3.

The signal electrode 124a (first signal electrode) and the signal electrode 124b are provided at the upper main surface of the board main body 12 in the first non-overlapping region A2 and the second non-overlapping region A3, respectively. In the present preferred embodiment, the signal electrodes 124a and 124b are provided at the upper main surface of the resin layer 16c in the first non-overlapping region A2 and the second non-overlapping region A3, respectively. Each of the interlayer connection conductors v21 and v22 penetrates the resin layer 16c in the up-down direction. The interlayer connection conductor v21 (a first interlayer connection conductor) electrically connects the signal electrode 124a and the first signal conductor layer 18a (the first end portion to of the first signal conductor layer 18a). The interlayer connection conductor v22 electrically connects the signal electrode 124b and the first signal conductor layer 18a (the second end portion tb of the first signal conductor layer 18a). Note that since the other structures of the circuit board 10h are the same as those of the circuit board 10a, description thereof will be omitted.

Like the circuit board 10h, the first end portion to of the first signal conductor layer 18a and the signal electrode 124a may be electrically connected to each other by using the interlayer connection conductor v21. Even in this case, since the first signal conductor layer 18a includes the first curved portion Ca, the number of interlayer connection conductors and the number of conductor patterns for connection can be reduced. Thus, a variation in characteristic impedance is reduced or prevented in the circuit board 10h. As a result, reflection of a high frequency signal can be reduced also in the circuit board 10h.

According to the circuit board 10h, an insertion loss of the circuit board 10h can be reduced for the same reason as that of the circuit board 10. According to the circuit board 10h, a variation in characteristic impedance of the first signal conductor layer 18a can be reduced or prevented at the first curved portion Ca for the same reason as that of the circuit board 10. According to the method of manufacturing the circuit board 10h, the circuit board 18a provided with the first signal conductor layer 10h including the first curved portion Ca can be easily manufactured for the same reason as that of the method of manufacturing the circuit board 10.

Ninth Modification

Hereinafter, a circuit board 10i according to a ninth modification will be described with reference to the drawings. FIG. 17 is a cross-sectional view of the circuit board 10i.

The circuit board 10i differs from the circuit board 10b in that the circuit board 10i further includes resin layers 16d and 16e, a second signal conductor layer 18b, interlayer connection conductors v51, v52, v61, and v62, and signal electrodes 130a and 130b. Hereinafter, the circuit board 10i will be described focusing on this difference.

The board main body 12 further includes the resin layers 16d and 16e. The board main body 12 has a structure in which the protection layer 17a, the resin layer 16a, the resin layer 16b, the resin layer 16d, and the resin layer 16e are laminated in this order from top to bottom.

The second signal conductor layer 18b is provided below the first signal conductor layer 18a in the board main body 12. In the present preferred embodiment, the second signal conductor layer 18b is provided on the upper main surface of the resin layer 16e. Thus, the second signal conductor layer 18b is provided below the second ground conductor layer 22. The second signal conductor layer 18b overlaps the second ground conductor layer 22 when viewed in the up-down direction. Thus, the second signal conductor layer 18b and the second ground conductor layer 22 form a microstrip line structure.

The second signal conductor layer 18b includes a curved portion Ce (fifth curved portion) where the second signal conductor layer 18b is curved in the up-down direction such that the second signal conductor layer 18b in the first non-overlapping region A2 is positioned above the second signal conductor layer 18b in the overlapping region A1. The second signal conductor layer 18b includes a curved portion Cf in which the second signal conductor layer 18b is curved in the up-down direction such that the second signal conductor layer 18b in the second non-overlapping region A3 is positioned above the second signal conductor layer 18b in the overlapping region A1.

Additionally, the second signal conductor layer 18b is electrically connected to a member (fourth member) disposed on the board main body 12 in the first non-overlapping region A2. The member is, for example, a signal terminal of the connector 200a in FIG. 6. Thus, the circuit board 10i has a structure, which will be described below.

The signal electrodes 130a and 130b are provided at the upper main surface of the board main body 12 in the first non-overlapping region A2 and the second non-overlapping region A3, respectively. In the present preferred embodiment, the signal electrodes 130a and 130b are provided at the upper main surface of the resin layer 16b in the first non-overlapping region A2 and the second non-overlapping region A3, respectively. The interlayer connection conductors v51 and v52 penetrate the resin layers 16b and 16d in the up-down direction, respectively. The interlayer connection conductors v51 and v52 are electrically connected to each other in series, thereby electrically connecting the signal electrode 130a and the second signal conductor layer 18b (the end portion to of the second signal conductor layer 18b). The interlayer connection conductors v61 and v62 penetrate the resin layers 16b and 16d in the up-down direction, respectively. The interlayer connection conductors v61 and v62 are electrically connected to each other in series, thereby electrically connecting the signal electrode 130b and the second signal conductor layer 18b (the end portion tf of the second signal conductor layer 18b).

In the circuit board 10i described above, the frequency of a high frequency signal transmitted through the second signal conductor layer 18b is lower than the frequency of a high frequency signal transmitted through the first signal conductor layer 18a. For example, a high frequency signal that has a relatively high frequency is transmitted through the first signal conductor layer 18a. On the other hand, a high frequency signal that has a relatively low frequency, a digital signal, or the like is transmitted through the second signal conductor layer 18b.

In the circuit board 10i, the second signal conductor layer 18b is provided below the first signal conductor layer 18a in the board main body 12. Because of this, a distance from the second signal conductor layer 18b to the upper main surface of the board main body 12 is longer than a distance from the first signal conductor layer 18a to the upper main surface of the board main body 12. Thus, the interlayer connection conductors v51 and v52 electrically connect the signal electrode 130a and the second signal conductor layer 18b (the end portion to of the second signal conductor layer 18b). Due to this, a variation in characteristic impedance may occur in the interlayer connection conductors v51 and v52. Thus, the frequency of a high frequency signal transmitted through the second signal conductor layer 18b is lower than the frequency of a high frequency signal transmitted through the first signal conductor layer 18a. A frequency of the high frequency signal transmitted through the second signal conductor layer 18b is not easily affected by the variation in characteristic impedance. Consequently, according to the circuit board 10i, reflection of a high frequency signal can be reduced in the first signal conductor layer 18a and the second signal conductor layer 18b.

The circuit board 10i can reduce reflection of a high frequency signal for the same reason as that of the circuit board 10. According to the circuit board 10i, an insertion loss of the circuit board 10i can be reduced for the same reason as that of the circuit board 10. According to the circuit board 10i, a variation in characteristic impedance of the first signal conductor layer 18a can be reduced or prevented at the first curved portion Ca for the same reason as that of the circuit board 10. According to the method of manufacturing the circuit board 10i, the circuit board 10i provided with the first signal conductor layer 18a including the first curved portion Ca can be easily manufactured for the same reason as that of the method of manufacturing the circuit board 10.

Tenth Modification

Hereinafter, a circuit board 10j according to a tenth modification will be described with reference to the drawings. FIG. 18 is a cross-sectional view of the circuit board 10j. FIG. 19 is a cross-sectional view of the circuit board 10j in manufacturing.

The circuit board 10j is different from the circuit board 10a in that a signal electrode 80c to which the second end portion tb of the first signal conductor layer 18a is electrically connected is provided at the lower main surface of the board main body 12. Hereinafter, the circuit board 10j will be described focusing on this difference.

As illustrated in FIG. 18, the board main body 12 includes the protection layer 17a, the resin layers 16a to 16c, 116a, and 116b, and the protection layer 17b. The board main body 12 has a structure in which the resin layer 116b, the protection layer 17a, the resin layers 16a to 16c and 116a, and the protection layer 17b are laminated in this order from top to bottom. Thus, the board main body 12 further includes the resin layer 16c (third resin layer) laminated below the resin layer 16b (second resin layer). Thus, the resin layer 16a and the resin layer 16b are in contact with each other. The resin layer 16b (second resin layer) and the resin layer 16c (third resin layer) are in contact with each other.

A length of the resin layer 16b in the left-right direction is longer than a length of the resin layer 16a in the left-right direction. Additionally, the length of the resin layer 16b in the left-right direction is longer than a length of the resin layer 16c in the left-right direction. Thus, as illustrated in FIG. 2, the board main body 12 includes the overlapping region A1, the first non-overlapping region A2, and a third non-overlapping region A4. The overlapping region A1 is a region where the resin layer 16a and the resin layer 16b are present when viewed in the up-down direction. Thus, in the overlapping region A1, the resin layer 16a and the resin layer 16b overlap each other when viewed in the up-down direction. In addition, the overlapping region A1 is a region where the resin layer 16b and the resin layer 16c are present when viewed in the up-down direction. Thus, in the overlapping region A1, the resin layer 16b and the resin layer 16c overlap each other when viewed in the up-down direction. The first non-overlapping region A2 is a region where the resin layer 16a is not present and the resin layer 16b is present when viewed in the up-down direction. Thus, in the first non-overlapping region A2, the resin layer 16a does not overlap the resin layer 16b. The third non-overlapping region A4 is a region where the resin layer 16c is not present and the resin layer 16b is present when viewed in the up-down direction. Thus, in the third non-overlapping region A4, the resin layer 16c does not overlap the resin layer 16b. The first non-overlapping region A2 is positioned at the left side of the overlapping region A1. The third non-overlapping region A4 is positioned at the right side of the overlapping region A1.

The resin layer 116a is disposed below the resin layer 16c in the first non-overlapping region A2. The resin layer 116b is disposed above the resin layer 16b in the third non-overlapping region A4.

The resin layer 16b in the first non-overlapping region A2 is positioned above the resin layer 16b in the overlapping region A1. Thus, the resin layer 16b is curved in the up-down direction in the vicinity of the boundary between the overlapping region A1 and the first non-overlapping region A2. Similarly, the resin layer 16b in the third non-overlapping region A4 is positioned below the resin layer 16b in the overlapping region A1. Thus, the resin layer 16b is curved in the up-down direction in the vicinity of the boundary between the overlapping region A1 and the third non-overlapping region A4. Thus, a position of the upper main surface of the resin layer 16b in the first non-overlapping region A2 in the up-down direction substantially coincides with a position of the upper main surface of the resin layer 16a in the overlapping region A1 in the up-down direction. A position of the lower main surface of the resin layer 16b in the third non-overlapping region A4 in the up-down direction substantially coincides with a position of the lower main surface of the resin layer 16c in the overlapping region A1 in the up-down direction. Note that similarly to the resin layers 16a and 16b, the resin layer 16c contains thermoplastic resin.

The first signal conductor layer 18a is provided in the board main body 12. The first signal conductor layer 18a is provided on the upper main surface of the resin layer 16b. The first signal conductor layer 18a has a linear shape including the first end portion ta and the second end portion tb. The first end portion ta is positioned in the first non-overlapping region A2. The second end portion tb is positioned in the third non-overlapping region A4.

The first signal conductor layer 18a includes the first curved portion Ca in which the first signal conductor layer 18a is curved in the up-down direction such that the first signal conductor layer 18a in the first non-overlapping region A2 is positioned above the first signal conductor layer 18a in the overlapping region A1. The first signal conductor layer 18a includes a fourth curved portion Cg in which the first signal conductor layer 18a is curved in the up-down direction such that the first signal conductor layer 18a in the third non-overlapping region A4 is positioned below the first signal conductor layer 18a in the overlapping region A1.

The circuit board 10j further includes ground electrodes 80a and 80b, a signal electrode 80c, and interlayer connection conductors v61 to v63. The ground electrode 80a is provided at the lower main surface of the resin layer 116a. The ground electrode 80b is provided at the upper main surface of the resin layer 116b. The signal electrode 80c is provided at the lower main surface of the resin layer 16b in the third non-overlapping region A4.

The interlayer connection conductor v61 penetrates the resin layer 116a in the up-down direction. The interlayer connection conductor v61 connects the second ground conductor layer 22 and the ground electrode 80a. The interlayer connection conductor v62 penetrates the resin layer 116b in the up-down direction. The interlayer connection conductor v62 connects the first ground conductor layer 20 and the ground electrode 80b. The interlayer connection conductor v63 penetrates the resin layer 16b in the up-down direction. The interlayer connection conductor v63 connects the first signal conductor layer 18a and the signal electrode 80c.

The ground electrode 80a is electrically connected to a member (for example, a terminal) disposed under the board main body 12. The ground electrode 80b is electrically connected to a member (for example, a terminal) disposed on the board main body 12. The signal electrode 80c is electrically connected to a member (for example, a terminal) disposed under the board main body 12. Due to this, the second end portion tb of the first signal conductor layer 18a is electrically connected to a member (a third member, for example, a terminal) disposed under the board main body 12. Note that since the other structures of the circuit board 10j are the same as those of the circuit board 10a, description thereof will be omitted.

The disposing process of the circuit board 10j as described above is performed as follows. To be more specific, as illustrated in FIG. 19, the resin layer 16a, the resin layer 16b, and the resin layer 16c are disposed such that the resin layer 16a, the resin layer 16b, and the resin layer 16c are aligned in this order from top to bottom, the resin layer 16a and the resin layer 16b are in contact with each other, the resin layer 16b and the resin layer 16c are in contact with each other, and the overlapping region A1, the first non-overlapping region A2, and the third non-overlapping region A4 are formed. To be specific, the resin layer 16a is placed over the resin layer 16b such that the left end portion of the resin layer 16b and the resin layer 16a do not overlap each other. The resin layer 16c is placed under the resin layer 16b such that the right end portion of the resin layer 16b and the resin layer 16c do not overlap each other. Furthermore, the resin layer 116a is disposed below the resin layer 16c in the first non-overlapping region A2. In the third non-overlapping region A4, the resin layer 116b is disposed over the resin layer 16a. Thereafter, the thermocompression bonding process is performed on the resin layers 16a to 16c, 116a, and 116b. Thereafter, the interlayer connection conductor v63 is formed in the resin layer 16b, and the signal electrode 80c is formed at the resin layer 16b.

The circuit board 10j can reduce reflection of a high frequency signal for the same reason as that of the circuit board 10. According to the circuit board 10j, an insertion loss of the circuit board 10j can be reduced for the same reason as that of the circuit board 10. According to the circuit board 10j, a variation in characteristic impedance of the first signal conductor layer 18a can be reduced or prevented at the first curved portion Ca for the same reason as that of the circuit board 10. According to the method of manufacturing the circuit board 10j, the circuit board 10j provided with the first signal conductor layer 18a including the first curved portion Ca can be easily manufactured for the same reason as that of the method of manufacturing the circuit board 10.

Eleventh Modification

Hereinafter, a circuit board 10k according to an eleventh modification will be described with reference to the drawings. FIG. 20 is a cross-sectional view of the circuit board 10k. FIG. 21 is a cross-sectional view of the circuit board 10k in manufacturing.

The circuit board 10k is different from the circuit board 10j for positions where the resin layers 116a and 116b are provided. Hereinafter, the circuit board 10k will be described focusing on this difference.

As illustrated in FIG. 20, the resin layer 116a is disposed under the resin layer 16b and on the resin layer 16c in the first non-overlapping region A2. In the third non-overlapping region A4, the resin layer 116b is disposed under the resin layer 16a and over the resin layer 16b. Since the other structures of the circuit board 10k are the same as those of the circuit board 10j, description thereof will be omitted.

The disposing process of the circuit board 10k as described above is performed as follows. To be more specific, as illustrated in FIG. 21, the resin layer 16a, the resin layer 16b, and the resin layer 16c are disposed such that the resin layer 16a, the resin layer 16b, and the resin layer 16c are aligned in this order from top to bottom, the resin layer 16a and the resin layer 16b are in contact with each other, the resin layer 16b and the resin layer 16c are in contact with each other, and the overlapping region A1, the first non-overlapping region A2, and the third non-overlapping region A4 are formed. At this time, in the first non-overlapping region A2, the resin layer 116a is disposed under the resin layer 16b and on the resin layer 16c. In the third non-overlapping region A4, the resin layer 116b is disposed under the resin layer 16a and over the resin layer 16b. Thereafter, the thermocompression bonding process is performed on the resin layers 16a to 16c, 116a, and 116b. Thereafter, the interlayer connection conductor v63 is formed in the resin layer 16b, and the signal electrode 80c is formed at the resin layer 16b.

The circuit board 10k can reduce reflection of a high frequency signal for the same reason as that of the circuit board 10. According to the circuit board 10k, an insertion loss of the circuit board 10k can be reduced for the same reason as that of the circuit board 10. According to the circuit board 10k, a variation in characteristic impedance of the first signal conductor layer 18a can be reduced or prevented at the first curved portion Ca for the same reason as that of the circuit board 10. According to the method of manufacturing the circuit board 10k, the circuit board 10k provided with the first signal conductor layer 18a including the first curved portion Ca can be easily manufactured for the same reason as that of the method of manufacturing the circuit board 10.

Other Preferred Embodiments

The circuit boards and the methods of manufacturing the circuit boards according to preferred embodiments of the present invention are not limited to the circuit boards 10 and 10*a* to 10*k* and the methods of manufacturing the same, and can be modified within the scope of the gist thereof. Thus, the configurations of the circuit boards 10 and 10*a* to 10*k* and the processes of the methods of manufacturing the same may be optionally combined.

Figure 22:
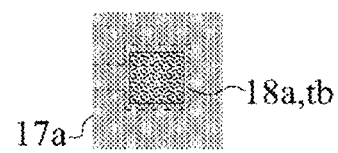

FIG. 22 is a top view of the first signal conductor layer 18*a*. As illustrated in FIG. 22, in the circuit boards 10, 10*a* to 10*k*, a portion of the first end portion to and a portion of the second end portion tb of the first signal conductor layer 18*a* may overlap the protection layer 17*a*.

Note that in the circuit boards 10, 10*a* to 10*k*, the first signal conductor layer 18*a* and the second signal conductor layer 18*b* have a linear shape. However, the first signal conductor layer 18*a* and the second signal conductor layer 18*b* may have a curved linear shape when viewed in the up-down direction.

Note that in the circuit boards 10, 10*a* to 10*k*, the first ground conductor layer 20 and the second ground conductor layer 22 are not essential structural features. Thus, in the circuit boards 10, 10*a* to 10*k*, one of the first ground conductor layer 20 or the second ground conductor layer 22 may be provided, or both of the first ground conductor layer 20 and the second ground conductor layer 22 do not need to be provided.

Note that in the circuit boards 10, 10*a* to 10*i*, only one of the first non-overlapping region A2 or the second non-overlapping region A3 may be provided.

Note that in the circuit board 10*b*, the lower end of the reinforcing member 120*a* (first reinforcing member) in the first non-overlapping region A2 may be positioned below the lower main surface of the board main body 12 in the overlapping region A1. Thus, the reinforcing member 120*a* may protrude downward from the lower main surface of the board main body 12 in the overlapping region A1. However, when the lower end of the reinforcing member 120*a* (first reinforcing member) in the first non-overlapping region A2 is positioned above the lower main surface of the board main body 12 in the overlapping region A1, the size of the circuit board 10*b* in the up-down direction is reduced.

In addition, in the circuit board 10*b*, the lower end of the reinforcing member 120*b* (first reinforcing member) in the second non-overlapping region A3 may be positioned below the lower main surface of the board main body 12 in the overlapping region A1. Thus, the reinforcing member 120*b* may protrude downward from the lower main surface of the board main body 12 in the overlapping region A1. However, when the lower end of the reinforcing member 120*b* (second reinforcing member) in the second non-overlapping region A3 is positioned above the lower main surface of the board main body 12 in the overlapping region A1, the size of the circuit board 10*b* in the up-down direction is reduced.

Further, in the circuit board 10*c*, the main component of the material of the resin layer 16*a* and the main component of the material of the resin layer 16*b* may be different from each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
   a board main body including a first resin layer and a second resin layer laminated below the first resin layer; and
   a first signal conductor layer provided on an upper main surface of the second resin layer;
   wherein the first resin layer and the second resin layer are in contact with each other;
   the board main body includes an overlapping region in which the first resin layer and the second resin layer are present when viewed in an up-down direction, and a first non-overlapping region in which the first resin layer is not present and the second resin layer is present when viewed in the up-down direction;
   the first signal conductor layer includes a first curved portion in which the first signal conductor layer is curved in the up-down direction such that the first signal conductor layer in the first non-overlapping region is positioned above the first signal conductor layer in the overlapping region; and
   a thickness of the first resin layer decreases in a direction approaching the first non-overlapping region from the overlapping region.

2. The circuit board according to claim 1, wherein
   the first signal conductor layer has a linear shape including a first end portion and a second end portion; and
   the first end portion is positioned in the first non-overlapping region and is electrically connected to a first member provided on the board main body.

3. The circuit board according to claim 2, wherein
   the board main body further includes a second non-overlapping region in which the first resin layer is not present and the second resin layer is present when viewed in the up-down direction;
   the first signal conductor layer includes a second curved portion in which the first signal conductor layer is curved in the up-down direction such that the first signal conductor layer in the second non-overlapping region is positioned above the first signal conductor layer in the overlapping region; and
   the second end portion is positioned in the second non-overlapping region and is electrically connected to a second member on the board main body.

4. The circuit board according to claim 3, further comprising:
   a second reinforcement below the second resin layer in the second non-overlapping region.

5. The circuit board according to claim 2, wherein the first end portion is positioned at the upper main surface of the board main body and functions as a first signal electrode.

6. The circuit board according to claim 2, further comprising:
   a first signal electrode provided at the upper main surface of the board main body in the first non-overlapping region; and
   a first interlayer connection conductor that electrically connects the first signal electrode and the first signal conductor layer.

7. The circuit board according to claim 2, wherein a line width of the first curved portion and a line width of the first end portion are larger than a line width of the first signal conductor layer in the overlapping region.

8. The circuit board according to claim 1, further comprising:

a first reinforcement below the second resin layer in the first non-overlapping region.

9. The circuit board according to claim 1, further comprising:
a first ground conductor layer provided in the board main body and on the first signal conductor layer; and
a second ground conductor layer provided in the board main body and below the first signal conductor layer; wherein
the first ground conductor layer and the second ground conductor layer overlap the first signal conductor layer when viewed in the up-down direction.

10. The circuit board according to claim 9, wherein the second ground conductor layer includes a third curved portion in which the second ground conductor layer is curved in the up-down direction such that the second ground conductor layer in the first non-overlapping region is positioned above the second ground conductor layer in the overlapping region.

11. The circuit board according to claim 10, further comprising:
a first ground electrode provided at the upper main surface of the board main body in the first non-overlapping region; and
a second interlayer connection conductor penetrating the second resin layer in the up-down direction in the first non-overlapping region, the second interlayer connection conductor electrically connecting the first ground electrode and the second ground conductor layer to each other.

12. The circuit board according to claim 1, wherein a dielectric constant of the second resin layer is lower than a dielectric constant of the first resin layer.

13. The circuit board according to claim 1, wherein a Young's modulus of a material of the first resin layer is larger than a Young's modulus of a material of the second resin layer.

14. The circuit board according to claim 1, wherein the first curved portion has a meander shape when viewed in the up-down direction.

15. The circuit board according to claim 1, wherein the first curved portion includes a plurality of notches extending in a line width direction.

16. The circuit board according to claim 1, further comprising:
a third resin layer laminated below the second resin layer; wherein
the first signal conductor layer has a linear shape including a first end portion and a second end portion;
the first end portion is positioned in the first non-overlapping region and is electrically connected to a first member on the board main body;
the third resin layer includes thermoplastic resin;
the board main body further includes a third non-overlapping region in which the third resin layer is not present and the second resin layer is present when viewed in the up-down direction;
the first signal conductor layer includes a fourth curved portion in which the first signal conductor layer is curved in the up-down direction such that the first signal conductor layer in the third non-overlapping region is positioned below the first signal conductor layer in the overlapping region; and
the second end portion is positioned in the third non-overlapping region and is electrically connectable to a third member below the board main body.

17. The circuit board according to claim 1, further comprising:
a second signal conductor layer below the first signal conductor layer in the board main body; wherein
the second signal conductor layer includes a fifth curved portion in which the second signal conductor layer is curved in the up-down direction such that the second signal conductor layer in the first non-overlapping region is positioned above the second signal conductor layer in the overlapping region;
the second signal conductor layer is electrically connected to a fourth member on the board main body in the first non-overlapping region; and
a frequency of a high frequency signal transmitted through the second signal conductor layer is lower than a frequency of a high frequency signal transmitted through the first signal conductor layer.

18. The circuit board according to claim 1, wherein the board main body further includes a protection layer covering an upper main surface of the first resin layer and the upper main surface of the second resin layer.

19. The circuit board according to claim 1, wherein an upper main surface of the first resin layer in the overlapping region and the upper main surface of the second resin layer in the first non-overlapping region are positioned on a same plane.

20. The circuit board according to claim 1, wherein a size of the board main body in the up-down direction in the first non-overlapping region is smaller than a size of the board main body in the up-down direction in the overlapping region.

21. The circuit board according to claim 20, further comprising:
a first reinforcement below the second resin layer in the first non-overlapping region; wherein
a lower end of the first reinforcement in the first non-overlapping region is positioned above a lower main surface of the board main body in the overlapping region.

22. The circuit board according to claim 1, wherein the first signal conductor layer is electrically connectable to a first member disposed on the board main body in the first non-overlapping region.

23. A method of manufacturing a circuit board comprising:
a first preparing process of preparing a first resin layer including thermoplastic resin;
a second preparing process of preparing a second resin layer including thermoplastic resin, the second resin layer including an upper main surface on which a first signal conductor layer is provided;
a disposing process of disposing the first resin layer and the second resin layer such that an overlapping region in which the first resin layer and the second resin layer are arranged in this order in a direction from top to bottom, the first resin layer and the second resin layer are in contact with each other, and the first resin layer is on the second resin layer when viewed in an up-down direction, and a first non-overlapping region in which the first resin layer is not on the second resin layer when viewed in the up-down direction are formed; and
a thermocompression bonding process of thermocompression-bonding the first resin layer and the second resin layer to each other to curve the first signal conductor layer in the up-down direction such that the first signal conductor layer in the first non-overlapping region is positioned above the first signal conductor layer in the overlapping region.

24. The method of manufacturing the circuit board according to claim 23, wherein in the disposing process, a first reinforcement is below the second resin layer in the first non-overlapping region.

25. The method of manufacturing the circuit board according to claim 24, wherein the first signal conductor layer is electrically connectable to a first member on a board main body including the first resin layer and the second resin layer in the first non-overlapping region.

26. A circuit board comprising:
- a board main body including a first resin layer, a second resin layer laminated below the first resin layer and a third resin layer laminated below the second resin layer; and
- a first signal conductor layer provided on an upper main surface of the third resin layer; wherein
- the first resin layer and the second resin layer are in contact with each other;
- the second resin layer and the third resin layer are in contact with each other;
- the board main body includes an overlapping region in which the first resin layer and the second resin layer are present when viewed in an up-down direction, and a first non-overlapping region in which the first resin layer is not present and the second resin layer is present when viewed in the up-down direction;
- the first signal conductor layer includes a first curved portion in which the first signal conductor layer is curved in the up-down direction such that the first signal conductor layer in the first non-overlapping region is positioned above the first signal conductor layer in the overlapping region.

* * * * *